United States Patent
Moddel

(10) Patent No.: US 11,837,971 B2
(45) Date of Patent: *Dec. 5, 2023

(54) SYSTEMS FOR DRIVING THE GENERATION OF PRODUCTS USING QUANTUM VACUUM FLUCTUATIONS

(71) Applicant: The Regents of the University of Colorado, a body corporate, Denver, CO (US)

(72) Inventor: Garret Moddel, Boulder, CO (US)

(73) Assignee: The Regents of the University of Colorado, a body corporate, Denver, CO (US)

( * ) Notice: Subject to any disclaimer, the term of this patent is extended or adjusted under 35 U.S.C. 154(b) by 38 days.

This patent is subject to a terminal disclaimer.

(21) Appl. No.: 17/589,239

(22) Filed: Jan. 31, 2022

(65) Prior Publication Data
US 2022/0311360 A1   Sep. 29, 2022

Related U.S. Application Data

(63) Continuation of application No. 16/870,860, filed on May 8, 2020, now Pat. No. 11,251,723, which is a (Continued)

(51) Int. Cl.
*H02N 11/00* (2006.01)
*H01L 33/00* (2010.01)
(Continued)

(52) U.S. Cl.
CPC .......... *H02N 11/002* (2013.01); *B01J 19/122* (2013.01); *C25B 1/04* (2013.01); (Continued)

(58) Field of Classification Search
CPC ................. H02N 11/002; B01J 19/122; B01J 2219/0892; B01J 2219/1203; C25B 1/04;
(Continued)

(56) References Cited

U.S. PATENT DOCUMENTS 5,590,031 A   12/1996   Mead, Jr. et al.
6,424,418 B2   7/2002   Kawabata et al.
(Continued)

FOREIGN PATENT DOCUMENTS

WO   0071894 A1   11/2000

OTHER PUBLICATIONS

Atar et al., "Plasmonically Enhanced Hot Electron Based Photovoltaic Device", Optics Express, vol. 21, No. 16, Mar. 14, 2013, pp. 7196-7201.
(Continued)

*Primary Examiner* — Pedro J Cuevas
(74) *Attorney, Agent, or Firm* — Kilpatrick Townsend & Stockton LLP

(57) ABSTRACT

Described herein are systems incorporating a Casimir cavity, such as an optical Casimir cavity or a plasmon Casimir cavity. The Casimir cavity modifies the zero-point energy density therein as compared to outside of the Casimir cavity. The Casimir cavities are paired in the disclosed systems with product generating devices and the difference in zero-point energy densities is used to directly drive the generation of products, such as chemical reaction products or emitted light.

20 Claims, 10 Drawing Sheets

Related U.S. Application Data continuation-in-part of application No. 16/855,897, filed on Apr. 22, 2020, now Pat. No. 11,258,379, and a continuation-in-part of application No. 16/855,890, filed on Apr. 22, 2020, now Pat. No. 11,133,758, and a continuation-in-part of application No. 16/855,892, filed on Apr. 22, 2020, now Pat. No. 11,463,026.

(60) Provisional application No. 62/904,666, filed on Sep. 23, 2019, provisional application No. 62/920,636, filed on May 10, 2019.

(51) Int. Cl.
| | |
|---|---|
| C25B 1/04 | (2021.01) |
| B01J 19/12 | (2006.01) |
| H01L 33/04 | (2010.01) |
| C25B 9/17 | (2021.01) |

(52) U.S. Cl.
CPC ............ *C25B 9/17* (2021.01); *H01L 33/0008* (2013.01); *H01L 33/0033* (2013.01); *H01L 33/0037* (2013.01); *H01L 33/04* (2013.01); *B01J 2219/0892* (2013.01); *B01J 2219/1203* (2013.01)

(58) Field of Classification Search
CPC ... C25B 9/17; H01L 33/0008; H01L 33/0033; H01L 33/0037; H01L 33/04
See application file for complete search history.

(56) References Cited

U.S. PATENT DOCUMENTS

| | | | |
|---|---|---|---|
| 6,477,028 | B1 | 11/2002 | Pinto |
| 6,593,566 | B1 | 7/2003 | Pinto |
| 6,650,527 | B1 | 11/2003 | Pinto |
| 6,665,167 | B2 | 12/2003 | Pinto |
| 6,782,179 | B2 | 8/2004 | Bozhevolnyi et al. |
| 6,842,326 | B2 | 1/2005 | Pinto |
| 6,920,032 | B2 | 7/2005 | Pinto |
| 7,043,134 | B2 | 5/2006 | Berini et al. |
| 7,110,154 | B2 | 9/2006 | Ballato et al. |
| 7,177,515 | B2 | 2/2007 | Estes et al. |
| 7,184,641 | B2 | 2/2007 | Karalis et al. |
| 7,379,286 | B2 | 5/2008 | Haisch et al. |
| 7,411,772 | B1 | 8/2008 | Tymes |
| 7,760,421 | B2 | 7/2010 | Lawandy |
| 7,773,228 | B1 | 8/2010 | Hollingsworth et al. |
| 8,039,368 | B2 | 10/2011 | Drndic et al. |
| 8,317,137 | B2 | 11/2012 | Cormier |
| 8,803,340 | B2 | 8/2014 | Moddel |
| 8,913,366 | B1 | 12/2014 | Mezinis |
| 9,581,142 | B2 | 2/2017 | Moddel |
| 9,634,158 | B2 | 4/2017 | Kobayashi et al. |
| 9,983,354 | B1 | 5/2018 | Ptasinski et al. |
| 10,199,414 | B2 | 2/2019 | Kobayashi et al. |
| 10,222,550 | B2 | 3/2019 | Ptasinski et al. |
| 10,612,971 | B2 | 4/2020 | Huang et al. |
| 10,996,379 | B2 | 5/2021 | Jornet et al. |
| 11,133,758 | B2 | 9/2021 | Moddel |
| 11,239,073 | B2 | 2/2022 | Fuhrer et al. |
| 11,251,723 | B2 | 2/2022 | Moddel |
| 11,258,379 | B2 | 2/2022 | Moddel |
| 11,463,026 | B2 * | 10/2022 | Moddel .................. H10N 60/20 |
| 11,563,388 | B2 * | 1/2023 | Moddel .................. H10N 99/05 |
| 2003/0179974 | A1 | 9/2003 | Estes et al. |
| 2003/0206708 | A1 | 11/2003 | Estes et al. |
| 2005/0151973 | A1 | 7/2005 | Naya et al. |
| 2006/0027709 | A1 | 2/2006 | Pinto |
| 2007/0007393 | A1 | 1/2007 | Pinto |
| 2007/0116420 | A1 | 5/2007 | Estes et al. |
| 2007/0241470 | A1 | 10/2007 | Haisch et al. |
| 2007/0273959 | A1 | 11/2007 | Lawandy |
| 2008/0296437 | A1 | 12/2008 | Cormier |
| 2009/0322221 | A1 | 12/2009 | Makansi |
| 2010/0142259 | A1 | 6/2010 | Drndic et al. |
| 2010/0237198 | A1 | 9/2010 | Cormier |
| 2012/0212375 | A1 | 8/2012 | Depree, IV |
| 2013/0283797 | A1 | 10/2013 | Bressi |
| 2014/0092520 | A1 | 4/2014 | Rosendorf |
| 2014/0092521 | A1 | 4/2014 | Rosendorf |
| 2014/0158887 | A1 | 6/2014 | Rosendorf |
| 2014/0158906 | A1 | 6/2014 | Rosendorf |
| 2014/0353577 | A1 | 12/2014 | Agarwal et al. |
| 2014/0374865 | A1 | 12/2014 | Kobayashi et al. |
| 2017/0199078 | A1 | 7/2017 | Huang et al. |
| 2017/0338355 | A1 | 11/2017 | Kobayashi et al. |
| 2018/0059704 | A1 | 3/2018 | Villalobos |
| 2019/0139760 | A1 | 5/2019 | Fuhrer et al. |
| 2019/0207537 | A1 | 7/2019 | Bressi |
| 2020/0011978 | A1 | 1/2020 | Chu |
| 2020/0357997 | A1 | 11/2020 | Moddel |
| 2020/0358375 | A1 | 11/2020 | Moddel |
| 2020/0358376 | A1 | 11/2020 | Moddel |
| 2020/0395872 | A1 | 12/2020 | Moddel |
| 2022/0006399 | A1 | 1/2022 | Moddel |
| 2022/0098477 | A1 | 3/2022 | May et al. |
| 2022/0216812 | A1 * | 7/2022 | Moddel ................ H02N 11/008 |
| 2022/0311360 | A1 * | 9/2022 | Moddel ............... H01L 33/0008 |

OTHER PUBLICATIONS

Blandford et al., "Applications of Classical Physics", Lecture Notes Chapter 6, California Institute of Technology, Version 12, Jan. 28, 2013, 23 pages.

Brongersma et al., "Plasmon-Induced Hot Carrier Science and Technology", Nature Nanotechnology, vol. 10, No. 1, Jan. 6, 2015, pp. 25-34.

Brongersma et al., "Surface Plasmon Nanophotonics", Springer Series in Optical Sciences, vol. 131, Sep. 2007, pp. 1-9.

Chalabi et al., "Hot-Electron Photodetection with a Plasmonic Nanostripe Antenna", Nano Letters, vol. 14, No. 3, Mar. 2014, pp. 1374-1380.

Clavero, "Plasmon Induced Hot-Electron Generation at Nanoparticle/ Metal-Oxide Interfaces for Photovoltaic and Photocatalytic Devices", Nature Photonics, vol. 8, No. 2, Jan. 30, 2014, pp. 95-103.

Cowell et al., "Barrier Height Estimation of Asymmetric Metal-Insulator-Metal-Tunneling Diodes", Journal of Applied Physics, vol. 114, No. 213703, Dec. 5, 2013, 7 pages.

Dmitriyeva et al., "Test of Zero-point Energy Emission From Gases Flowing Through Casimir Cavities", Physics Procedia, vol. 38, Nov. 8, 2012, pp. 8-17.

Du et al., "Ultrafast Plasmon Induced Electron Injection Mechanism in Gold-Ti02 Nanoparticle System", Journal of Photochemistry and Photobiology C: Photochemistry Reviews, vol. 15, Jun. 2013, pp. 21-30.

Gall, "Electron Mean Free Path in Elemental Metals", Journal of Applied Physics, vol. 199, Feb. 2016, pp. 085101-1-085101-5.

Genet et al., "Casimir Force and the Quantum Theory of Lossy Optical Cavities", Physical Review A, vol. 67, No. 4, Feb. 10, 2003, 18 pages.

Gong et al., "Design of Plasmonic Cavities for Solid-State Cavity Quantum Electrodynamics Applications", Applied Physics Letters, vol. 90, No. 3, Jan. 2007, pp. 033113-1-033113-3.

Grover et al., "Metal Single-Insulator and Multi-Insulator Diodes for Rectenna Solar Cells", Rectenna Solar Cells, Jul. 2013, 21 pages.

Helman et al., "Theory of Internal Photoemission", Physical Review B, vol. 7, No. 8, Apr. 15, 1973, pp. 3702-3705.

Herner et al., "High Performance MIIM Diode Based on Cobalt Oxide/Titanium Oxide", Applied Physics Letters, vol. 110, May 2017, pp. 223901-1-223901-4.

Intravaia et al., "Strong Casimir Force Reduction Through Metallic Surface Nanostructuring", Nature Communications, vol. 4, Issue 1, Sep. 27, 2013, pp. 1-8.

Jiang et al., "Photoelectrochemical Devices for Solar Water Splitting-Materials and Challenges", Chemical Society Reviews, vol. 46, No. 15, Jul. 2017, pp. 4645-4660.

(56) References Cited

OTHER PUBLICATIONS

John et al., "Optical Properties of Graphene, Silicene, Germanene, and Stanine from IR to Far UV—A First Principles Study", Journal of Physics and Chemistry of Solids, vol. 110, Nov. 2017, 1 page.
Kish, "Stealth Communication: Zero-Power Classical Communication, Zeroquantum Quantum Communication and Environmental-Noise Communication", Applied Physics Letters, vol. 87, No. 23, Dec. 2005, 15 pages.
Kish et al., "Zero-Point Term and Quantum Effects in the Johnson Noise of Resistors: A Critical Appraisal", Journal of Statistical Mechanics: Theory and Experiment, vol. 2016, No. 5, May 20, 2016, 13 pages.
Knight et al., "Embedding Plasmonic Nanostructure Diodes Enhances Hot Electron Emission", Nano Letters, vol. 13, No. 4, Mar. 2013, 1 page.
Kodama et al., "Fast Heating of Ultrahigh-Density Plasma as a Step Towards Laser Fusion Ignition", Nature, vol. 412, No. 6849, Aug. 23, 2001, pp. 798-802.
Lambe et al., "Light Emission from Inelastic Electron Tunneling", Physical Review Letters, vol. 37, No. 14, Oct. 4, 1976, pp. 923-925.
Lebedev et al., "The Dynamics of Wire Array Z-Pinch Implosions", Physics of Plasmas, vol. 6, No. 5, Apr. 1999, 2 pages.
Li, "Latest Progress in Hydrogen Production from Solar Water Splitting via Photocatalysis, Photoelectrochemical, and Photovoltaic-Photoelectrochemical Solutions", Chinese Journal of Catalysis, vol. 38, No. 1, Jan. 2017, pp. 5-12.
McCarthy et al., "Enhancement of Light Emission from Metal-Insulator-Metal Tunnel Junctions", Applied Physics Letters, vol. 30, No. 8, Apr. 1977, pp. 427-429.
Mizuguchi et al., "Simulation of High-Energy Proton Production by Fast Magnetosonic Shock Waves in Pinched Plasma Discharges", Physics of Plasmas, vol. 14, No. 3, Mar. 2007, pp. 032704-1-032704-7.
Moddel et al., "Extraction of Zero-Point Energy from the Vacuum: Assessment of Stochastic Electrodynamics-Based Approach as Compared to Other Methods", Atoms, vol. 7, No. 51, May 23, 2019, pp. 1-18.
Moddel, "Will Rectenna Solar Cells Be Practical?", Rectenna Solar Cells, Jul. 2013, pp. 3-24.
Ozawa et al., "Preparation and Characterization of the Eu3+ Doped Perovskite Nanosheet Phosphor: $La_{0.90}Eu_{0.05}Nb_2O_7$", Chemistry of Materials, vol. 19, No. 26, Nov. 2007, pp. 6575-6580.
Sze et al., "Physics of Semiconductor Devices", John Wiley & Sons, Dec. 13, 2006, 5 pages.
Van Dorp et al., "SIC: A Photocathode for Water Splitting and Hydrogen Storage", Angewandte Chemie International Edition, vol. 48, No. 33, 2009, pp. 6085-6088.
Visser et al., "Follow-up: What is the 'Zero-Point Energy' (or 'Vaeuuin Energy') in Quantum Physics? Is It Really Possible That We Could Harness This Energy?", Available Online at https://www.scientificamerican.com/article/follow-up-what-is-the-zer/, Aug. 18, 1997, pp. 1-7.
Viswanath et al., "A Nanosheet Phosphor of Double-Layered Perovskite with Unusual Intrananosheet Site Activator Concentration", Chemical Engineering Journal, vol. 122044, Nov. 2019, 12 pages.
Walter et al., "Solar Water Splitting Cells", Chemical Reviews, vol. 110, No. 11, Nov. 2010, pp. 6446-6473.
Wang et al., "Field-Assisted Splitting of Pure Water Based on Deep-Sub-Debyelength Nanogap Electrochemical Cells", American Chemical Society Nano, vol. 11, No. 8, Jul. 2017, 13 pages.
Wang et al., "Light Emission from the Double-Barrier Al/AhO3/Al/AhO3/Au Tunnel Junction", Thin Solid Films, vol. 371, Nos. 1-2, Aug. 2000, pp. 191-194.
Wang et al., "Plasmonic Energy Collection Through Hot Carrier Extraction", Nano Letters, vol. 11, No. 12, Oct. 2011, 1 page.
Yam, "Exploiting Zero-Point Energy", Scientific American, vol. 277, No. 6, Dec. 1, 1997, pp. 54-57.
Zhu, "Graphene Geometric Diodes for Optical Rectennas", Department of Electrical, Computer, and Energy Engineering, University of Colorado, 2014, 112 pages.
Zhu et al., "Graphene Geometric Diodes for Terahertz Rectennas", Journal of Physics D Applied Physics, vol. 46, No. 18, Apr. 2013, pp. 1-6.
International Application No. PCT/IB2020/054254 received an International Search Report and Written Opinion, dated Jul. 31, 2020, 11 pages.
International Application No. PCT/IB2020/054255 received an International Search Report and Written Opinion, dated Aug. 3, 2020, 11 pages.
International Application No. PCT/IB2020/054256 received an International Search Report and Written Opinion, dated Nov. 5, 2020, 13 pages.
International Application No. PCT/US2020/032251 received an International Search Report and Written Opinion, dated Sep. 22, 2020, 15 pages.

\* cited by examiner

SYSTEMS FOR DRIVING THE GENERATION OF PRODUCTS USING QUANTUM VACUUM FLUCTUATIONS

CROSS REFERENCE TO RELATED APPLICATIONS

This application is a continuation of U.S. patent Ser. No. 16/870,860, filed on May 8, 2020, which is a continuation-in-part of U.S. patent application Ser. Nos. 16/855,890, 16/855,892, and 16/855,897, all filed on Apr. 22, 2020, and claims the benefit of and priority to U.S. Provisional Application No. 62/904,666, filed on Sep. 23, 2019. These applications are hereby incorporated by reference in their entireties.

FIELD

This invention is in the field of devices. This invention relates generally to quantum devices for generating products such as fuel and light.

BACKGROUND

According to quantum theory the quantum vacuum is filled with electromagnetic radiation in the form of quantum vacuum fluctuations. There has been substantial discussion about whether this energy can be harvested, and if so, how. A chief problem in harvesting this energy is that it forms the energy ground state, and so it does not flow from one region to another. However, the quantum vacuum energy is geometry-dependent, and its density is lower in a Casimir cavity than outside of a Casimir cavity. The use of Casimir cavities therefore opens the possibility of making use of the quantum vacuum fluctuations to drive energy from one location to another.

SUMMARY

Devices for generation of products, such as fuel and light, are described herein. In embodiments, devices described herein use two different regions in which the energy density of the quantum vacuum is different to drive energy through a device such that a portion of the energy can be captured and/or used directly for driving a chemical reaction or in a process of generating light.

In an aspect, systems are disclosed for generation and capture of charge carriers that are excited by quantum vacuum fluctuations. Systems of this aspect may use an asymmetry in quantum vacuum fluctuations with respect to a device, such as a product generating device, to drive a flow of energy or particles or waves through the device for use in generating products, such as fuel or light. Systems of this aspect may also or alternatively comprise a product generating device having a structure permitting fast transport and/or capture of a charge carrier excited by quantum vacuum fluctuations. In some embodiments, a system of this aspect may include a Casimir photocatalyzer or a Casimir light source.

An example system of this aspect may comprise a product generating device and a zero-point-energy-density-reducing structure adjoining the device. In embodiments, the zero-point-energy-density-reducing structure provides an asymmetry with respect to the device that drives a flow of energy or particles or waves across the device. The devices disclosed herein are distinguished from photoelectrolysis systems, or devices that make use of light from an externally applied voltage or current, or light source in the case of photoelectrolysis, to generate products such as fuel or light and are capable of producing a flow of energy or particles or waves that occurs even in the absence of external sources of illumination or power. Stated another way, the disclosed devices are capable of producing fuel or light whether in dark conditions or in light conditions and whether a voltage or current is provided by an external source or not.

The asymmetry noted above may produce a voltage difference between a first region of the product generating device and a second region of the product generating device. The asymmetry may produce a net charge flow between a first region of the product generating device and a second region of the product generating device. The asymmetry may provide a reduction in a zero-point energy density on a first side of the product generating device as compared to the zero-point energy density on the first side of the product generating device in an absence of the zero-point-energy-density-reducing structure. The asymmetry may provide a difference between a first zero-point energy density on a first side of the product generating device and a second zero-point energy density on a second side of the product generating device, such that the difference drives a flow of energy through the product generating device.

At least a portion of the flow of energy is used in the systems of this aspect by the product generating device, such as to generate light or produce fuel. In contrast to conventional light-emitting devices and photocatalysis, electrochemical photolysis, and photoelectrolysis systems used for fuel production, the flow of energy occurs even in an absence of application of voltage or current to the product generating device from an external source and/or in an absence of external sources of illumination.

Example zero-point-energy-density-reducing structures useful with the systems of this aspect include Casimir cavities. For example, the zero-point-energy-density-reducing structure may comprise an optical Casimir cavity or a plasmon Casimir cavity.

In cases where the desired products of the systems of this aspect are a fuel, the product generating device comprises a chemical reaction device, in which reaction products are generated by the flow of energy. Optionally, the product generating device comprises an electrolysis device or a photocatalysis device. An example chemical reaction device comprises a first electrode adjoining the zero-point-energy-density-reducing structure; a second electrode in electrical communication with the first electrode; and an electrolyte between the first electrode and the second electrode. Such a configuration may be operable for electrolysis of water.

In cases where the desired products of the systems of the aspect are light, the product generating device comprises a light emission device, in which the flow of energy induces direct generation of light. An example, light emission device may comprise a phosphor positioned adjacent to the zero-point-energy-density-reducing structure, so as to provide a cathodoluminescent structure. Other useful light emission devices include those comprising a plasmon-driven light emission device, or a structure exhibiting a negative differential resistance.

Without wishing to be bound by any particular theory, there can be discussion herein of beliefs or understandings of underlying principles relating to the invention. It is recognized that regardless of the ultimate correctness of any mechanistic explanation or hypothesis, an embodiment of the invention can nonetheless be operative and useful.

DETAILED DESCRIPTION

Quantum vacuum fluctuations fill all space with electromagnetic radiation. The energy density of this radiation in free space is $$\rho(hf) = \frac{8\pi f^2}{c^3}\left(\frac{hf}{\exp(hf/kT)-1} + \frac{hf}{2}\right) \quad \text{Eq. 1}$$

where h is Planck's constant, f is the frequency of the radiation, c is the speed of light, k is Boltzmann's constant, and T is the temperature. The first term in brackets in Eq. 1 is due to thermal blackbody radiation at non-zero temperatures, and the second term is temperature independent and corresponds to the quantum vacuum radiation.

Figure 1:
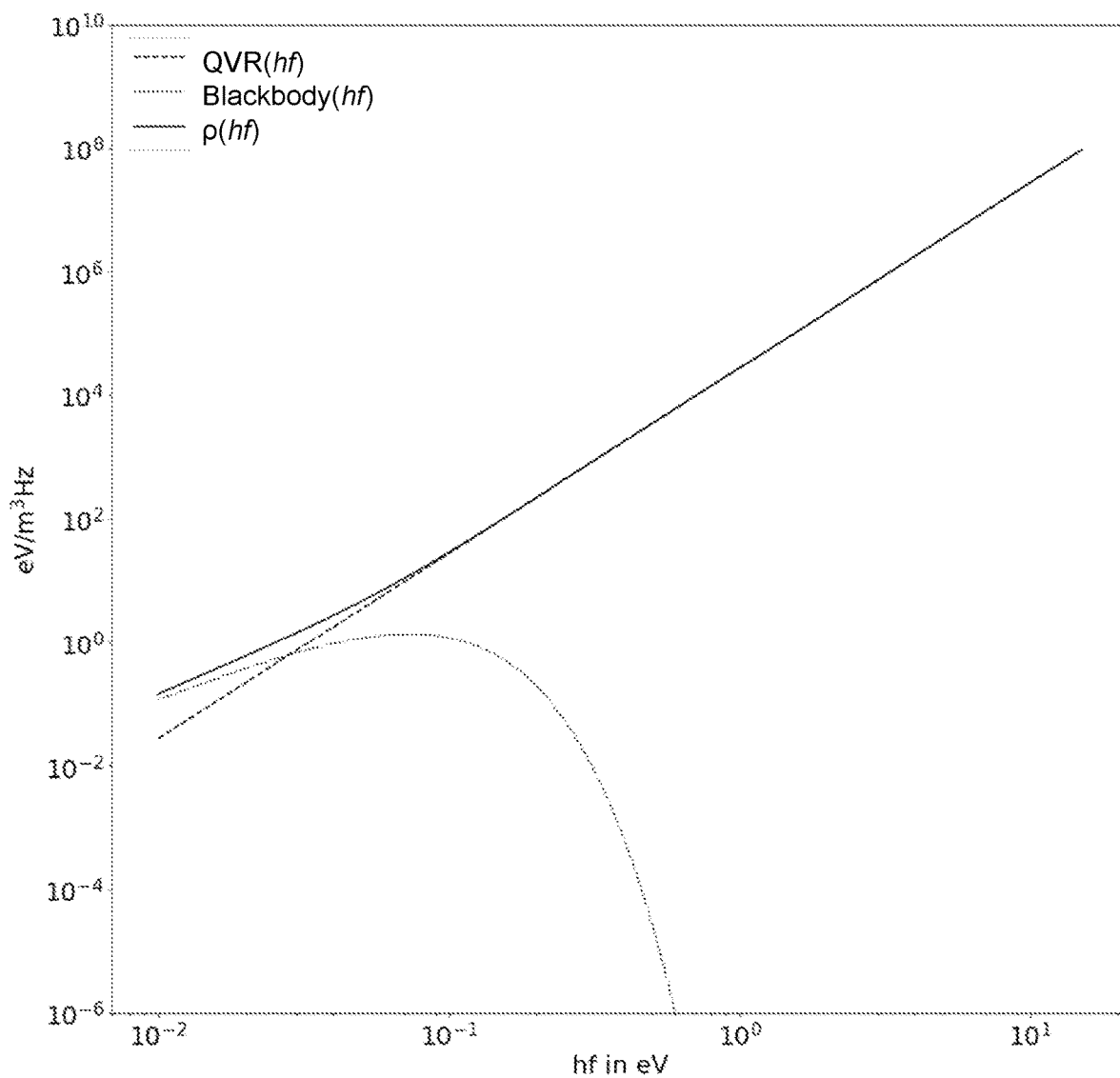
FIG. 1 provides a plot showing energy density spectra for quantum vacuum radiation and blackbody radiation.

The energy density ($\rho(hf)$) spectrum for both the temperature dependent term and the temperature independent term in Eq. 1 is shown in FIG. 1, where the data is plotted as a function of photon energy, hf, where h is Planck's constant and f is optical frequency, which varies with the reciprocal of the wavelength. At 300 K, the thermal component (labeled Blackbody(hf) in FIG. 1) reaches its maximum in the infrared through visible parts of the spectrum, whereas the quantum vacuum radiation (labeled QVR(hf) in FIG. 1) component grows with the frequency cubed and becomes much larger than the thermal component of the spectrum at visible light frequencies and beyond (as shown in Eq. 1, above, and Eq. 2, below). For 300 K blackbody radiation, the quantum vacuum radiation component exceeds the thermal part for any frequencies above 7 THz, corresponding to a photon energy of approximately 29 meV. Because the energy density of the quantum vacuum radiation part of the spectrum at high frequencies is much larger than that of the thermal spectrum, much more power may be available from the quantum vacuum radiation.

Harvesting and using energy arising out of the quantum vacuum radiation does not appear to violate any physical laws, but because the energy corresponds to that of the ground-state, there is generally no driver for the energy to flow. However, the quantum vacuum radiation is geometry dependent, and its density can be different in different regions of space. For example, a zero-point-energy-density-reducing structure can establish a geometric condition where the quantum vacuum radiation density in one region of space can be lower than in free space, such as outside the structure, which, therefore, provides a condition for energy flow to occur. One approach is described in U.S. Pat. No. 7,379,286, which is hereby incorporated by reference.

One example of a zero-point-energy-density-reducing structure is a Casimir cavity. As used herein, the term Casimir cavity includes both optical Casimir cavities and plasmon Casimir cavities, both of which are described in detail below. As a brief introduction, an optical Casimir cavity can be formed using two closely-spaced, parallel reflecting plates. As a result of the requirement that the tangential electric field must vanish (for an ideal reflector) at the boundaries, limits are placed on which quantum vacuum modes (i.e., field patterns) are allowed between the plates. In general, the modes allowed include those where the gap spacing is equal to an integer multiple of half of the wavelength. Modes having wavelengths longer than twice the gap spacing are largely excluded. This results in the full spectrum of quantum vacuum modes exterior to the plates, described by Eq. 1, being larger and more numerous than the constrained set of modes in the interior, and thus there is a lower energy density in the interior. The critical dimension, which determines the wavelength above which quantum vacuum modes are suppressed, is the gap spacing (for the case of a one dimensional optical Casimir cavity). Optical Casimir cavities can also be constructed in the form of cylinders (nanopores), in which case the critical dimension is the diameter. Optical Casimir cavities may be formed having other geometries as well, which can be used with the disclosed devices. Aspects described herein make use of the fact that the quantum vacuum energy level is dependent upon the local geometry, specifically the presence of a zero-point-energy-density-reducing structure, like a Casimir cavity.

Zero-point energy is the ground state energy of a system that remains even at zero temperature. Quantum vacuum fluctuations include zero-point energy fluctuations in the form of electromagnetic radiation. Quantum vacuum radiation is one type of zero-point energy that exists in free space and transparent media. Zero-point energy-driven modes exist in media beside free space, and in waves besides electromagnetic waves. Other waves include phonons, polaritons including plasmons, plasma oscillations, and electromagnetic waves in matter, spin waves, and acoustic waves. Only high frequency waves that carry sufficient energy are of interest for harvesting, similar to the condition for quantum vacuum radiation shown in FIG. 1. For each of these waves supporting zero-point energy-driven modes, the energy can be extracted if a spatial gradient in the zero-point energy magnitude can be provided, similar to the way an optical Casimir cavity can create a spatial difference in zero-point energy densities in the form of quantum vacuum radiation.

Plasmons are charge oscillations and include surface plasmons and volume or bulk plasmons. Surface plasmons can exist at interfaces between conductors, plasmas, or charged gases, and dielectrics, such as insulators, semiconductors, and air. Bulk or volume plasmons are longitudinal charge oscillations inside conductors, plasmas, or charged gases, and generally have a higher energy and frequency than surface plasmons. The term plasmon is used herein to refer to both surface and bulk plasmons, and other infrared through ultraviolet light frequency polaritons in materials. Plasmons in conductors, including metals, or at conductor interfaces can support waves having frequencies of interest, and therefore cavities that suppress a range of plasmon modes can provide the sort of asymmetry needed for zero-point energy harvesting and can be used as zero-point-energy-density reducing structures. These structures are referred to herein as plasmon Casimir cavities and are described in further detail later.

Figure 2:
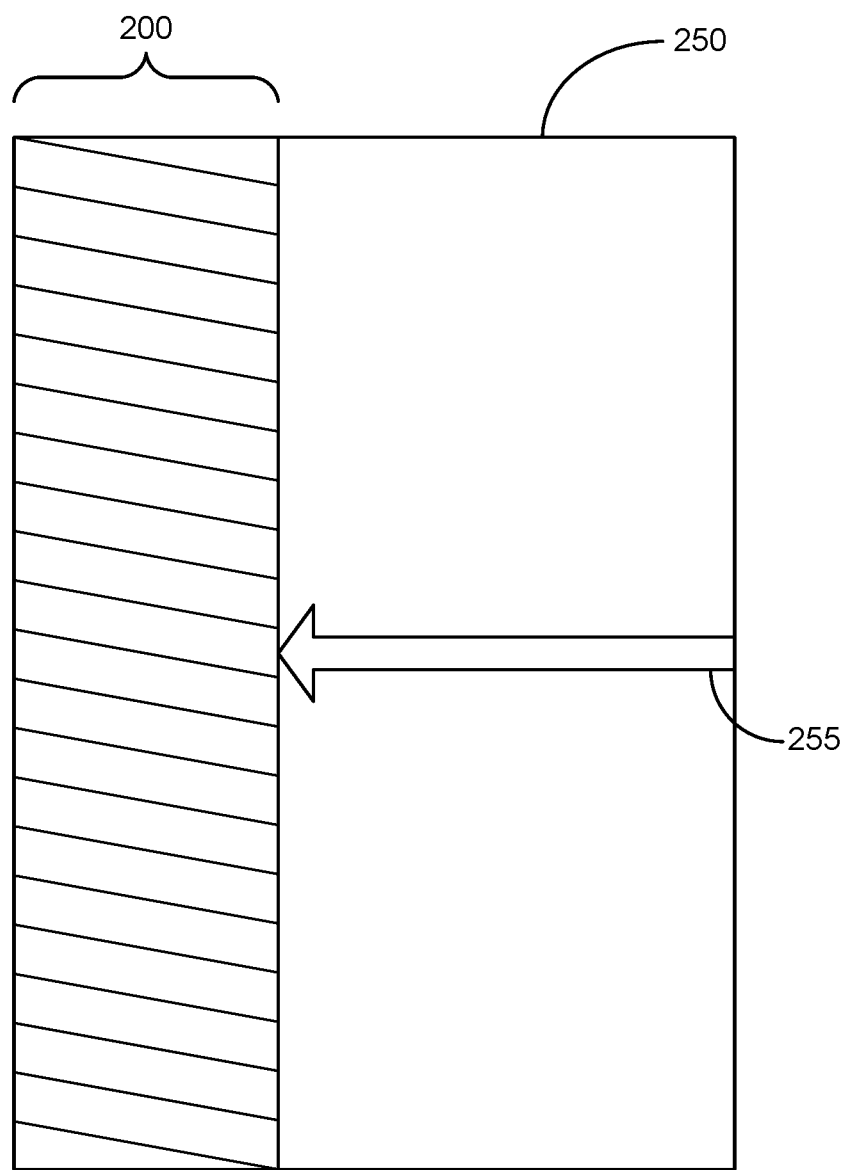
FIG. 2 provides a schematic illustration of an example device driven by an energy density difference, in accordance with some embodiments.

To be able to make use of a difference in zero-point energy densities, an asymmetry with respect to a zero-point-energy-density-reducing structure may be used, allowing a portion of the energy to be harvested. FIG. 2 shows an example arrangement, where a zero-point-energy-density-reducing structure 200 can be used to establish an asymmetry in zero-point energy densities between one side of a transport medium 250 and the other, such as by having one side of the transport medium 250 face the zero-point-energy-density-reducing structure 200, for example. By using a structure for producing an asymmetry in the zero-point energy density on one side of the device with respect to the other, and a structure for transport (e.g., the transport medium 250) of the excited charge away from the excitation location, a net power across the transport medium from the side that has no zero-point-energy-density-reducing structure, and hence has a higher zero-point energy level, to the side with the zero-point-energy-density-reducing structure, which has a lower zero-point energy density, can flow across the transport medium 250, as schematically shown by arrow 255. The same concept applies if both sides have zero-point-energy-density-reducing structures, but having different critical dimensions or frequency cutoffs.

Figure 3:
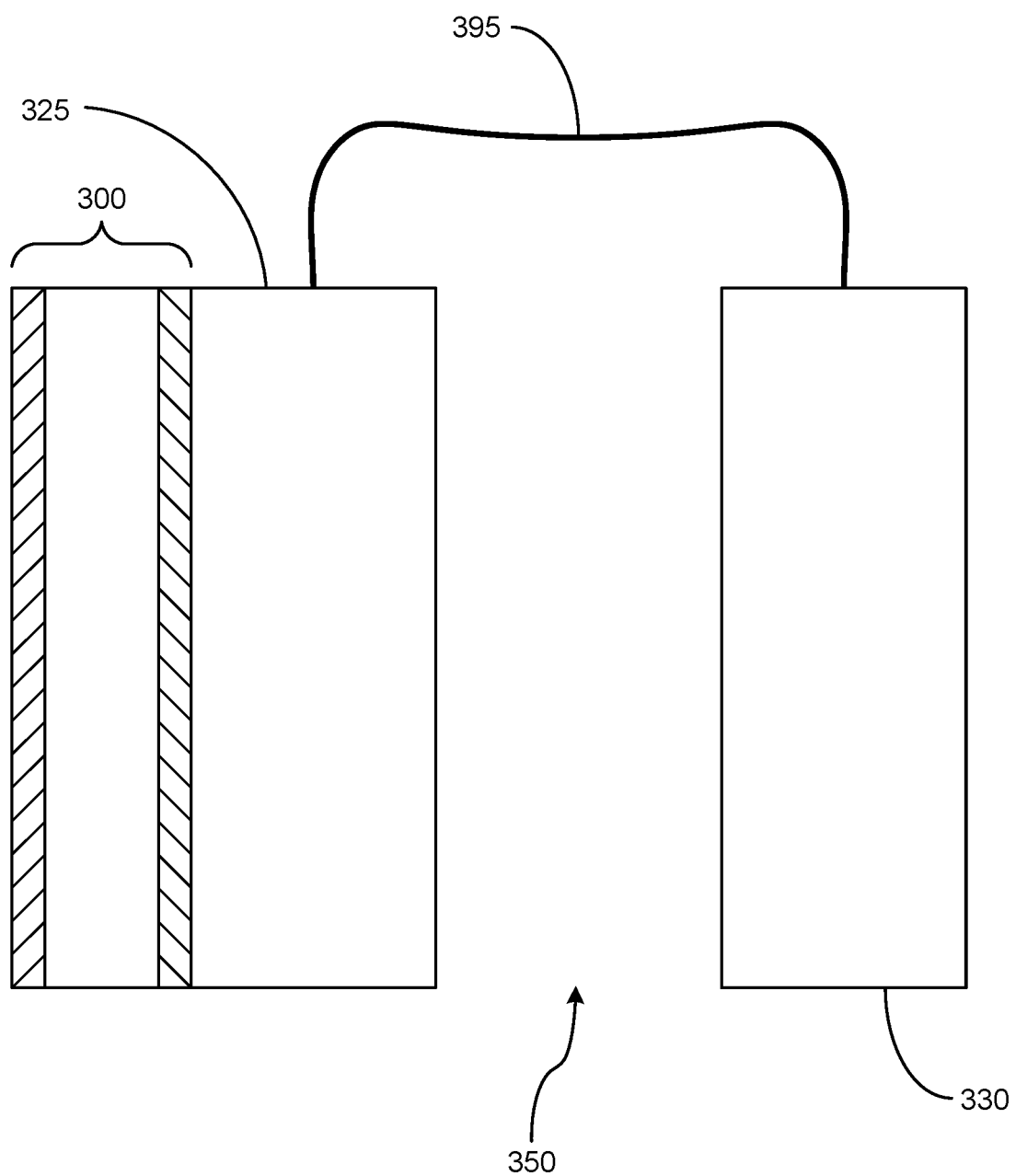
FIG. 3 provides a schematic illustration of an example system driven by an energy density difference, in accordance with some embodiments.

In the above description of a zero-point-energy-density-reducing structure depicted in FIG. 2, the energy is shown to travel from one side of a transport medium to the other. This flow of energy can be used in a system for directly generating products, such as light or chemical or electrochemical reaction products, by coupling a product generating device adjacent to or adjoining a zero-point-energy-density-reducing structure. FIG. 3 shows an example arrangement for such a system, where a zero-point-energy-density-reducing structure 300 is adjacent to a first device component 325 but not adjacent to a second device component 330, establishing an asymmetry in zero-point energy densities between them. A transport medium 350 is positioned between the first device component 325 and the second device component 330. First device component 325, second device component 330, and transport medium 350 can be components of a product generating device. In FIG. 3, first device component 325 is adjacent to, and energetically constrained by, the zero-point-energy-density-reducing structure 300, while the second device component 330 is unconstrained by the zero-point-energy-density-reducing structure 300. By using a structure for producing an asymmetry in the zero-point energy density at the first device component 325 with respect to the second device component 330, and a structure for transport (e.g., the transport medium 350) of energy or waves or charge, a net power can flow from the device second device component 330 that has no zero-point-energy-density-reducing structure, and hence has a higher zero-point energy level, to the first device component 325 adjacent to the zero-point-energy-density-reducing structure 300, which has a lower zero point energy density, driving the generation of products. For example, if the first device component 325, the second device component 330, and the transport medium 350 are constructed appropriately, the flow of energy can be used to directly drive oxidation and/or reduction reactions without actually having to harvest the energy as an electrical voltage and/or current, and can directly produce chemical fuel. An electrical lead 395 can be connected between the first device component 325 and the second device component 330, providing a return path for current to flow as the oxidation and/or reduction reactions occur. As another example, the flow of energy can be used to directly cause emission of light, such as where the flow of energy causes electrons to interact with a phosphor, again without actually having to harvest the energy as an electrical voltage and/or current.

Another way to characterize an asymmetry requirement is in terms of equilibrium and detailed balance. In equilibrium, the flow of energy from any first element to any second element must be balanced by an equal energy flow from the second element to the first element. This results from a detailed balance. A zero-point-energy-density-reducing structure can facilitate a means to break this balance, so that there is a smaller flow of energy from the side of a device with the zero-point-energy-density-reducing structure than from the side of a device without it.

Figure 4:
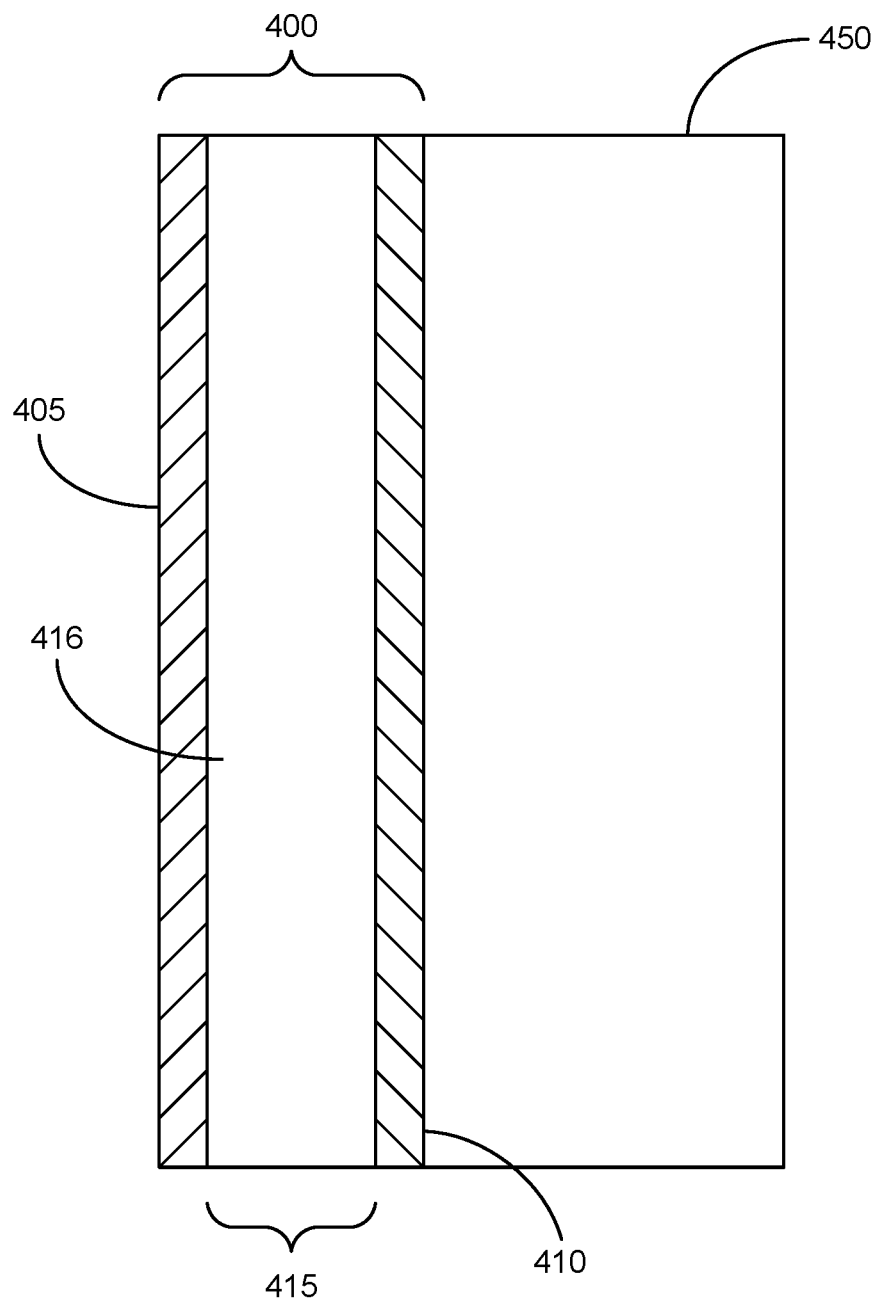
FIG. 4 provides a cross-sectional illustration of an example Casimir cavity adjacent to an example device, in accordance with some embodiments.

Optical Casimir cavities. FIG. 4 provides an illustration of an example of an optical Casimir cavity 400 adjacent to a transport medium 450, which may comprise or correspond to a portion of a product generating device, for example. Optical Casimir cavity 400 comprises a first reflector 405, a second reflector 410, and a gap 415 between the first reflector 405 and the second reflector 410. Gap 415 (also referred to herein as a cavity layer) may be an empty gap (e.g., evacuated or corresponding to a vacuum) or filled with a gas, which may be achieved with rigid substrates and spacers. In some embodiments, gap 415 may be filled with a material 416, such an at least partially transparent optical material for at least some wavelengths of electromagnetic radiation supported by the optical Casimir cavity, preferably the entire visible range through the near ultraviolet. In contrast with a gas, material 416 may comprise a condensed-phase material, such as a solid, liquid, or liquid crystal. Example materials useful as a cavity layer include, but are not limited to, silicon oxide or aluminum oxide. Alternatively, it may be sufficient or desirable to fill the gap with a polymer such as PMMA (polymethyl methacrylate), polyimide, polymethyl methacrylate, or silicone, which can provide adequate transparency at wavelengths of interest. In some examples, the material of a cavity layer, such as those materials described above, may have a transmittance of greater than 20% for at least some wavelengths of electromagnetic radiation from 100 nm to 10 µm. Advantageously, the material of a cavity layer may have a transmittance of greater than 50% for at least some wavelengths of electromagnetic radiation from 100 nm to 10 µm. In some cases, the material of the cavity layer, including at least some of the materials described above, may have a transmittance of greater than 70% or greater than 90% for at least some wavelengths of electromagnetic radiation from 100 nm to 10 µm. The thickness or spacing of gap 415 can be set by the target wavelength range for the optical Casimir cavity. In some examples, the gap 415 of a Casimir cavity can have a spacing of from 10 nm to 2 µm.

The reflector material for first reflector 405 and/or second reflector 410 can be chosen based upon its reflectivity over the wavelength range of interest, ease of deposition, and/or other considerations, such as cost. The reflector thickness must be sufficient to provide adequate reflectivity, but not so thick as to be difficult to pattern. In some examples, a reflector can have a thickness of at least 10 nm, such as from 10 nm to 1 cm. Example materials useful as a reflector of an optical Casimir cavity include, but are not limited to, metals, dielectric reflectors, or diffractive reflectors, such as Bragg reflectors or metamaterial reflectors. Example metals useful for a reflector of an optical Casimir cavity include, but are not limited to, Al, Ag, Au, Cu, Pd, or Pt. Example dielectrics useful for a dielectric reflector include, but are not limited to $ZrO_2$, $SiO_2$, $Si_3N_4$, $Nb_2O_5$, $TiO_2$, $MgF_2$, LiF, $Na_3AlF_6$, $Ta_2O_5$, $LaTiO_3$, $HfO_2$, ZnS, ZnSe, or the like. Example reflectivity for at least one of the two reflectors of an optical Casimir cavity is from 50% to 100% for at least some wavelengths of electromagnetic radiation from 100 nm to 10 µm. The reflectors of an optical Casimir cavity do not have to be metals or dielectric reflectors, and instead a reflective interface may be used. For example, the reflective layer can be a step in the index of refraction at an interface between two adjacent materials, such as between the cavity layer and its surrounding material. In some cases the cavity walls can provide a step in dielectric constant or index of refraction on transitioning from one dielectric material to another one or more, or between a dielectric material and free space.

Alternatively, an optical Casimir cavity may be formed from a distributed Bragg reflector type multilayer dielectric stack. For example such a stack can comprise alternating layers of two or more dielectric materials having different indices of refraction. For the case of two types of materials, the thickness of each pair of layers characterizes the pitch. Wavelengths of twice the pitch are reflected, and longer wavelengths are largely suppressed. It is to be noted that this differs from antireflection coatings, in which the pitch is one quarter of a wavelength rather than one half of a wavelength, which is the case here. The layer thicknesses may further be chirped to enhance the spectral width of the reflections. Any suitable number of alternating dielectric layers of can be used, such as from 2 layers to 100 layers, or more.

In FIG. 4, a transport medium 450 is positioned adjacent to the optical Casimir cavity 400 such that one side of the transport medium 450 faces the optical Casimir cavity 400, establishing an asymmetry. Transport medium 450 can comprise a material that permits transmission of charge carriers, which can be used in a process of product generation via the difference in zero-point energy densities established by the presence of the optical Casimir cavity 400.

In the systems described herein that employ optical Casimir cavities, the charge carriers that are excited can be used directly to generate products, such as chemical reaction products or light emission. To make use of or capture energy in the form of charge carrier excitation, the charge carrier will need to be transported away from the point at which it is launched and captured. Transport and capture of the charge carrier may need to be performed on very fast (i.e., short) time scales. For example, the transport and/or capture may occur in a time interval of less than or about 1 ps, less than or about 100 fs, less than or about 10 fs, less than or about 1 fs, or less than or about 0.1 fs. In some cases, the longer the time is, the smaller the fraction of energy available will be captured. Description of the need for fast transport and capture of charge carriers is described in further detail below.

Casimir Photoinjector. Photons impinging on the surface of a conductor can cause charge carriers, usually electrons, in the conductor to become photoexcited, producing hot carriers. If the conductor layer is sufficiently thin, then these hot carriers can traverse the conductor layer and enter the material on the other side of it. This process is called internal photoemission, and also photoinjection. When this thin conductor layer is adjacent to a thin insulator, herein called a transport medium or transport layer, which is adjacent to a second conductor layer, the hot carriers can traverse the transport layer and enter the second conductor. Although carriers may also be excited thermally, this is not treated in the present description because it generally produces no net current or generation of products for the devices described.

Figure 5:
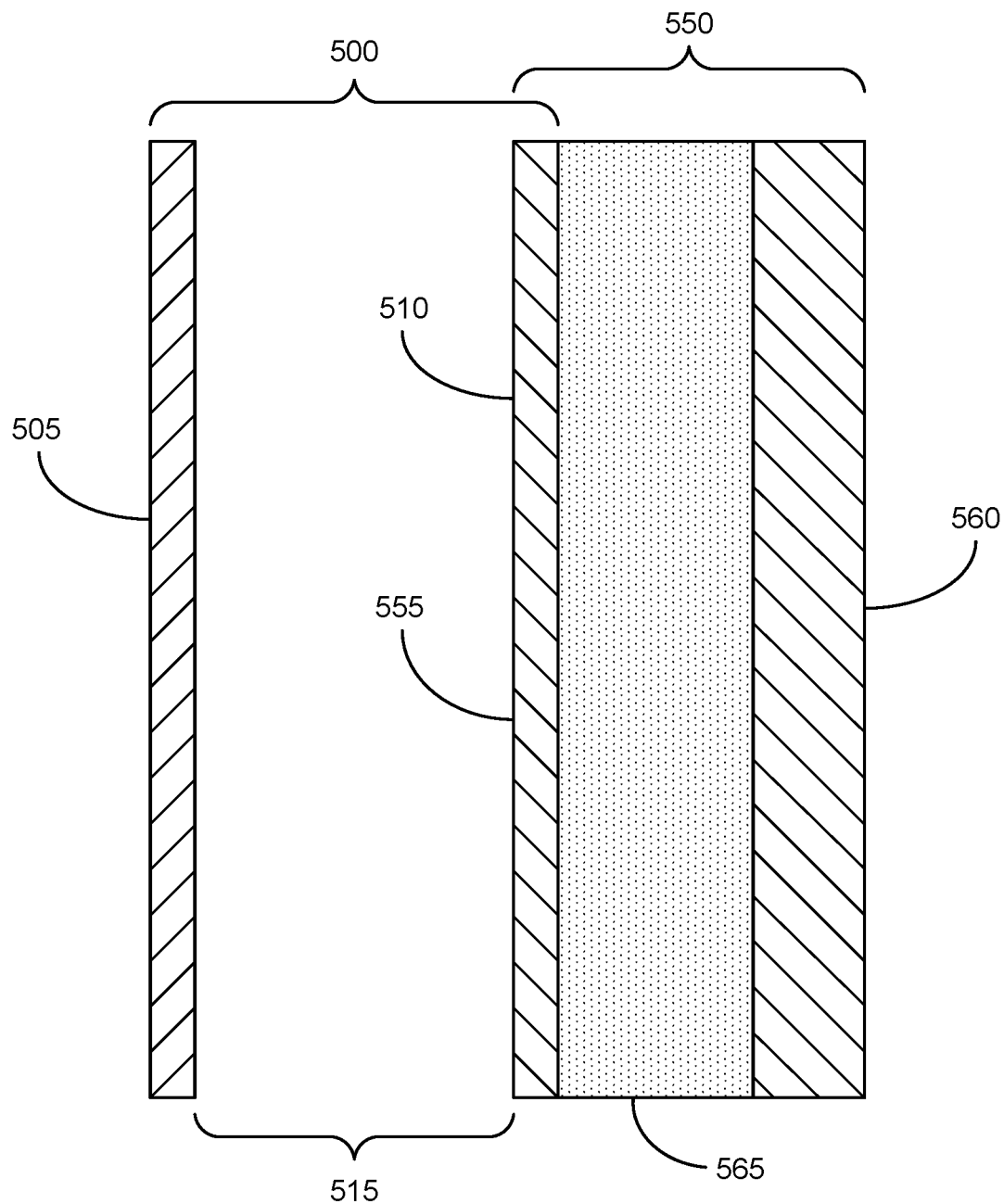
FIG. 5 provides a cross-sectional illustration of an example Casimir photoinjector, in accordance with some embodiments.

An example of a device that can make use of a difference in the flux of photoexcited charge carriers in two directions for directly generating products, such as driving a chemical reaction or generating light, is a Casimir photoinjector. A cross-sectional illustration of an example Casimir photoinjector is provided in FIG. 5. The Casimir photoinjector in FIG. 5 comprises a Casimir cavity 500 disposed adjacent to or contiguous with a product generating device 550. Casimir cavity 500 comprises a first reflector 505, a second reflector 510, and a gap 515, which may optionally be filled with a material, as described above. Product generating device 550 comprises a first conductive layer 555, a second conductive layer 560, and a transport layer 565 between the first conductive layer 555 and the second conductive layer 560. In such a configuration, first conductive layer 555 can function, at least in part, as the second reflector 510 of Casimir cavity 500.

Example materials for the first conductive layer 555 and/or the second conductive layer 560, include, but are not limited to metals, semiconductors (e.g., low band-gap semiconductors), two-dimensional conductive materials, and conductive ceramics. In some cases, the second conductive layer 560 may optionally comprise an electrolyte, such as an aqueous electrolyte. Example materials for transport layer 565, include, but are not limited to, dielectrics, some semiconductors, and electrolytes, such as aqueous electrolytes. Example aqueous electrolytes include sodium and lithium salt solutions, base electrolytes such as a KOH, NaOH, and $B_4K_2O_7$ solutions, and acid solutions such as $H_2SO_4$. Solid polymer electrolytes can also be used, such as Nafion.

In first conductive layer 555, there are at least two ways to excite the carriers into the hot carrier state. One is from photons impinging on the outer surface of the conductor, producing photoexcited carriers as described above. Ignoring thermally generated (blackbody) photons, a source of photons that can produce photoexcited carriers is the ambient quantum vacuum modes. Another non-thermal way to excite the carriers is from the internal zero-point energy fluctuations in the material of the first conductive layer 555. The combination of these two methods produces hot carriers that can enter the transport layer 565.

In the second conductive layer 560, a similar situation exists except that the second conductive layer 560 is too thick to allow photoexcited carriers produced on the outer surface of the conductor to penetrate the second conductive layer 560 and reach the transport layer 565. Instead the photoexcited carriers are scattered in the second conductive layer 560 and lose their excess energy, such as in the form of phonons and plasmons. Therefore, in the second conductive layer 560, the only non-thermal excitation source for hot carriers is from the internal zero-point energy fluctuations in the material of the second conductive layer 560. Because the second conductive layer 560 is thicker than the first conductive layer 555, the overall internal generation rate of excited carriers that are available to traverse the transport layer 565 is greater than that in the thinner first conductive layer 555.

Under equilibrium conditions, the carrier current from the second conductive layer 560 must be exactly the same as the carrier current produced in the first conductive layer 555 from the combination of internal and external energy sources. The current of carriers from the first conductive layer 555 to the second conductive layer 560 is precisely balanced by the current of carriers from the second conductive layer to the first conductive layer under equilibrium conditions.

On the other hand, with Casimir cavity 500 covering the first conductive layer 555, then the flux of photons impinging on the outer surface of the first conductive layer 555 is reduced. Hence, the generation rate of photoexcited carriers is reduced. This upsets the balance in the current of carriers between the two conductive layers, such that a there is a net current of carriers (e.g., electron current) from the second conductive layer 560 to the first conductive layer 555. Because the carriers are usually electrons, which carry a negative charge, the conventional positively-charged current flows from the first conductive layer 555 to the second conductive layer 560. In some cases, in contrast to the illustration in FIG. 5, another Casimir cavity may be positioned adjacent to second conductive layer, which can have a different critical dimension (i.e., gap) from that of Casimir cavity 500, to provide an imbalance in the current of carriers between the two conductive layers 555 and 560.

The Casimir photoinjector is a DC (direct current) device, in which differing average currents originating from first conductive layer 555 and second conductive layer 560 produce a voltage between first conductive layer 555 and second conductive layer 560. This voltage or average difference in currents can be exploited for driving chemical reactions at product generating device 550 configured as a chemical reaction device. The flow of charge carriers through the transport layer can also or alternatively be used for generation of light at product generating device 550 configured as a light emission device. These aspects are each described in further detail below.

Regarding the time interval for how quickly energy from the zero-point fluctuations must be extracted before it is returned to its source or is cancelled by an opposite-energy pulse, and becomes unavailable, this time interval may be governed by a tradeoff in the amount of energy that is available to be extracted from the vacuum, $\Delta E$, and time interval that is available for extraction, $\Delta t$. This results in a $\Delta F \Delta t \leq$ constant so that the larger the energy to be extracted, the shorter the time that it is available. If that constant is equal to h/2, where h is Planck's constant divided by $2\pi$, then, based on this relationship, harvesting the energy of a photon of 2 eV ($\Delta E$), would indicate that $\Delta t \leq 0.16$ fs. Since hot electron transport across a thin insulating layer can occur in times that approach 1 fs, under this condition the transport process can be used to extract at least a fraction of the zero-point energy-excited charge carriers.

Other structures that support charge transport from internal photoemission can be used as Casimir photoinjectors in place of the conductor/transport layer/conductor arrangement described above. These include Schottky diodes, and metal/insulator/semiconductor (MIS) diodes, Mott diodes, quantum well diodes, ballistic diodes, carbon nanotube diodes, superconductor/insulator/superconductor (SIS) devices, and other structures that facilitate the injection of charge as known to those skilled in the art.

The transport distance, and hence transport time, for a Schottky-diode can be larger than for the case of the conductor/transport layer/conductor structures described herein. Because of the longer transport time, the fraction of hot carriers that are captured and collected can be diminished. A shorter accumulation or depletion width may result in a quicker capture time. To reduce the width of the accumulation or depletion layer, the semiconductor may be doped heavily, for example, such as with a dopant concentration of from $10^{15}$ cm$^{-3}$ to $10^{21}$ cm$^{-3}$, or a subrange thereof. In some cases, a thin semiconductor region between conductive layers, which is a variation on a Schottky barrier called a thin Mott barrier, can be used to reduce the transport distance. Both of these methods of reducing the transport distance can reduce the transport time and hence increase the fraction of hot carriers that are captured and collected.

Plasmon Casimir cavities. In contrast to an optical Casimir cavity, where zero-point energy electromagnetic oscillations in vacuum or transparent media are suppressed, a cavity in which zero-point energy plasmon oscillations are suppressed is referred to herein as a plasmon Casimir cavity.

A plasmon Casimir cavity can be formed by structuring a conductive medium in a way that limits the zero-point energy plasmon modes that are supported by the medium. This can be accomplished, for example, by incorporating a periodic structure having a pitch that suppresses a band of zero-point energy plasmons. Plasmon wavelengths of twice the pitch are reflected, and longer wavelengths are largely suppressed. This results in the full spectrum of zero-point energy modes exterior to the plasmon Casimir cavity being larger and more numerous than the constrained set of modes in the interior, and thus there is a lower energy density in the interior.

One way to produce such a periodic structure is with use of a distributed Bragg reflector. Such a reflector can be formed using metamaterials, metasurfaces, or multilayer stacks of different conductors, and can suppress a range of plasmonic modes in a conductor, similar to the way that an optical Casimir cavity suppresses a range of electromagnetic modes. The plasmon Casimir cavity can be used in specific structures to provide an asymmetry in zero-point energy density, as described below.

Figure 6:
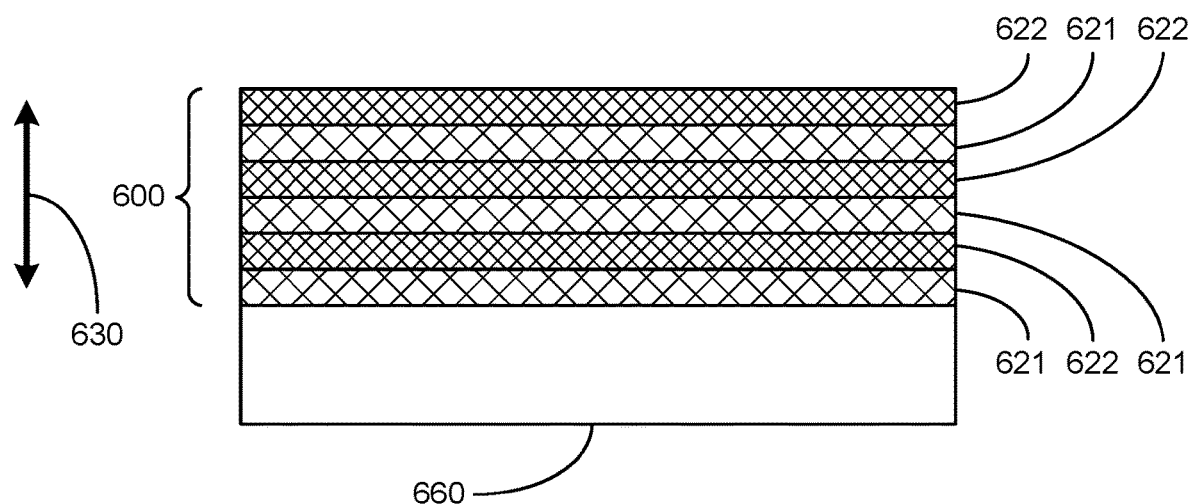
FIG. 6 provides a cross-sectional illustration of an example plasmon Casimir cavity, in accordance with some embodiments.

FIG. 6 provides an illustration of an example plasmon Casimir cavity 600 including a distributed Bragg reflector type multilayer stack. Plasmon Casimir cavity 600 is analogous to a dielectric stack reflector that is used to form an optical mirror, but is instead formed from layers of conductors 621 and 622 to form a plasmon reflector, which can be used to suppress plasmon modes in the vertical direction, as shown by arrow 630. The configuration shown in FIG. 6 incorporates at least two types of conductors 621 and 622 that differ in their plasmonic properties, such as free electron density, electron mass, electron mobility, Fermi level or morphology. At high frequencies where the conductors become transparent, usually in the ultraviolet, the two types of conductors differ in index of refraction. Conductors 621 and 622 are formed as an alternating stack in which the thickness of each pair of layers characterizes the pitch. Plasmon wavelengths of twice the pitch are reflected, and longer wavelengths are largely suppressed. The layer thicknesses may further be chirped to enhance the spectral width of the reflections. Optionally, a very thin dielectric or semiconductor (e.g., comprising $SiO_2$, $Al_2O_3$, NiO, $Nb_2O_5$, $Ta_2O_5$, CrO, a-Si:H (hydrogenated amorphous silicon), or $TiO_2$), such as having a thickness between 0.2 and 20 nm, can substitute for an individual layer of conductor 621 or 622 or can be incorporated into an individual layer of conductor 621 or 622 to supplement the plasmon reflection characteristics. The suppression results in the full spectrum of zero-point energy modes exterior to the plasmon Casimir cavity being larger and more numerous than the constrained set of modes in the interior, and thus there is a lower energy density in the interior. One example is alternating conductor layers of Ag (electron density of $6 \times 10^{22}$ cm$^{-2}$) and Al (electron density of $18 \times 10^{22}$ cm$^{-2}$) in which each layer is 50 nm thick, to provide a pitch of 100 nm. If each pair of alternating layers is 100 nm thick, ten pairs of such alternating layers would be 1 µm thick. Any suitable number of alternating layers of conductors 621 and 622 can be used, such as from 2 layers to 100 layers, or more. As an example, FIG. 6 shows 3 pairs. It will be appreciated that other multilayer structures incorporating conductors known to those skilled in the art may also be used to restrict the plasmon spectrum and provide a plasmon Casimir cavity.

Since plasmon Casimir cavities can suppress a range of plasmon modes, they can provide the sort of asymmetry needed for zero-point energy harvesting. To harvest or capture energy in the form of a charge carrier, the charge carrier will need to be transported away from the point at which it is launched and captured. Transport and capture of the charge carrier may need to performed at very fast time scales. For example, the transport and/or capture may occur in a time interval of less than or about 1 ps, less than or about 100 fs, less than or about 10 fs, less than or about 1 fs, or less than or about 0.1 fs. In some cases, the longer the time is, the smaller the fraction of energy available will be captured. Description of fast transport and capture of charge carriers generated using plasmon Casimir Cavities is described in further detail below.

Plasmon injector. Plasmons within a conductor can transfer energy to charge carriers in the conductor so that they become excited, producing hot carriers. When the conductor is adjacent to a thin transport layer, which is adjacent to a second conductor, the hot carriers can traverse the transport layer and enter the second conductor. In addition, plasmons can induce carrier tunneling through a transport layer.

Figure 7:
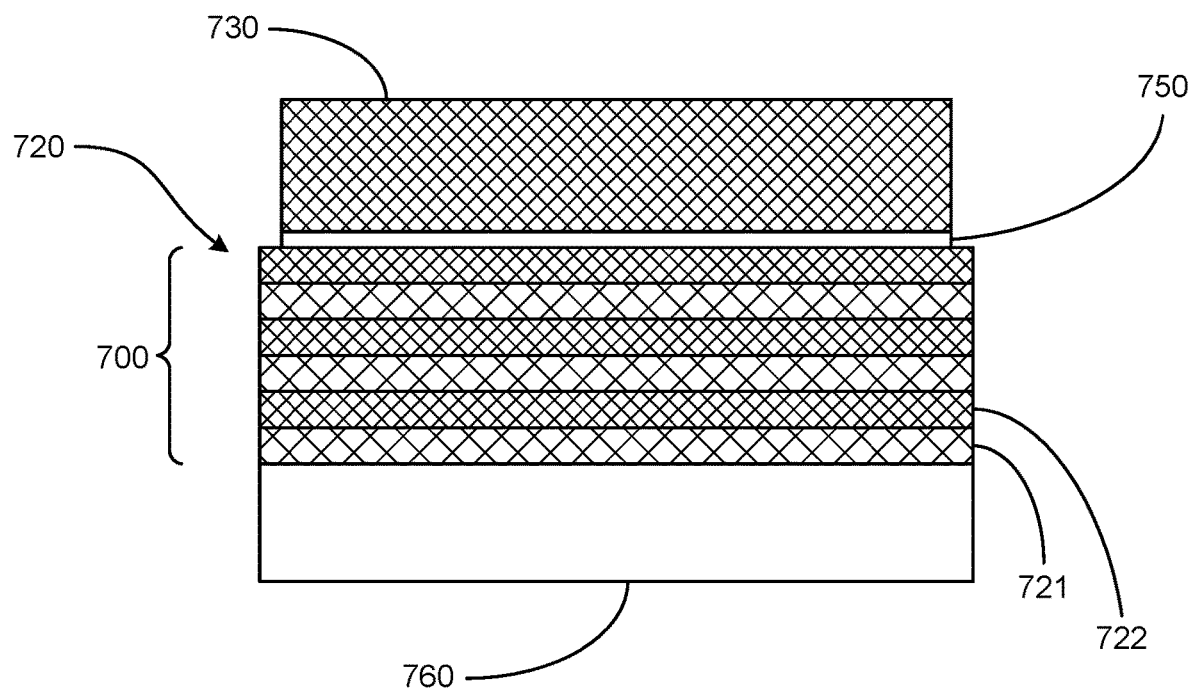
FIG. 7 provides a cross-sectional illustration of an example plasmon injector device, in accordance with some embodiments.

An example of a device that can make use of a difference in the flux of plasmon excited charge carriers in two directions for harvesting energy or direct generation of products is a plasmon injector. A cross-sectional illustration of an example plasmon injector is provided in FIG. 7. The plasmon injector in FIG. 7 comprises a conductor/transport layer/conductor device including a plasmon Casimir cavity 700 as the first conductor 720, a transport layer 750 adjacent to and in contact with plasmon Casimir cavity 700, and a second conductor 730 adjacent to and in contact with transport layer 750. Transport layer 750 is positioned between the plasmon Casimir cavity 700 and the second conductor 730. Plasmon Casimir cavity 700 is depicted in FIG. 7 as a multilayer conductor stack, with alternating layers of one conductor 721 and another conductor 722, but can also be formed with other structures that restrict the plasmon spectrum. Transport layer 750 and second conductor 730 can comprise portions of a product generating device.

The orientation of plasmon Casimir cavity 700, second conductor 730, and transport layer 750 shown in FIG. 7 is not intended to be limiting, but may correspond to one way for orienting these components relative to a supporting dielectric and may allow for a simplified fabrication, in some embodiments. Alternatively, the alternating conductors 721 and 722 can be supported by a dielectric, which can also support the transport layer 750 and second conductor 730 (e.g., to provide a horizontal orientation rather than the vertical orientation shown in FIG. 7).

Example materials for the conductor of the plasmon Casimir cavity, such as conductors 721 and 722 and/or the second conductor 730, include, but are not limited to metals, superconductors, semiconductors (e.g., low band-gap semiconductors), two-dimensional conductive materials, conductive ceramics and or other materials that support plasmons. In some cases, the second conductor 730 may optionally comprise an electrolyte, such as an aqueous electrolyte. Example materials for transport layer 750, include, but are not limited to, dielectrics, some semiconductors, and electrolytes, such as aqueous electrolytes. Example aqueous electrolytes include sodium and lithium salt solutions, base electrolytes such as a KOH, NaOH, and $B_4K_2O_7$ solutions, and acid solutions such as $H_2SO_4$. Solid polymer electrolytes can also be used, such as Nafion.

As noted above, plasmon Casimir cavity 700 limits the plasmon spectrum therein, but second conductor 730 has no limiting metasurface and so the full spectrum of surface plasmon modes that the second conductor 730 can support are allowed. In the plasmon Casimir cavity 700, carriers can be excited into the hot carrier state by zero-point energy-driven plasmon modes, and these hot carriers can enter the transport layer 750, and also carriers can tunnel from the first conductor 720 through the transport layer 750 to the second conductor 730. In the second conductor 730, a similar situation exists, where carriers can be excited into the hot carrier state by zero-point energy-driven plasmon modes, and also carriers can tunnel from the second conductor 730 through the transport layer 750 to the first conductor 720. Under equilibrium conditions in the absence of a plasmon Casimir cavity configuration, the carrier current from a first conductor on one side of a transport layer must be exactly the same as the carrier current from a second conductor on the opposite side of transport layer. On the other hand, with the configuration of a plasmon Casimir cavity 700, the supported zero-point energy-driven plasmon modes therein are reduced. Hence, the generation rate of hot carriers from plasmon Casimir cavity 700 is reduced, and also the density of plasmons available to induce tunneling from first conductor 720 is reduced. This upsets the balance in the current of carriers between the plasmon Casimir cavity 700 and the second conductor 730, such that there is a net current of carriers (e.g., electron current) from the second conductor 730 to the first conductor 720. Because the carriers are usually electrons, which carry a negative charge, the conventional positively-charged current flows from the plasmon Casimir cavity 700 to the second conductor 730.

The plasmon injector is a DC (direct current) device, in which differing average currents originating from plasmon Casimir cavity 700 and second conductor 530 produce a voltage between them. This voltage or average difference in currents can be exploited for driving chemical reactions in a chemical reaction device. The flow of charge carriers through the transport layer can also or alternatively be used for generation of light in a light emission device. These aspects are each described in further detail below.

As with the optical Casimir cavities described above, the time interval for how quickly energy from the zero-point energy driven plasmon fluctuations must be extracted before it is returned to its source or is cancelled by an opposite-energy pulse, and becomes unavailable, may be governed by a tradeoff in the amount of energy that is available to be extracted from the zero-point field, $\Delta E$, and time interval that is available for extraction, $\Delta t$. In general, capturing more of the available energy may need to occur in shorter times.

Time scales on the order of 1 fs or less are desirable for extracting at least a fraction of the zero-point energy-excited charge carriers, so very thin transport layers are generally used.

Other structures that support charge transport from plasmon generated carriers can be used in a plasmon injector in place of the conductor/transport layer/conductor arrangement described above. These include Schottky diodes, and metal/insulator/semiconductor (MIS) diodes, Mott diodes, quantum well diodes, carbon nanotube diodes, superconductor/insulator/superconductor (SIS) devices, and other structures that facilitate the injection of charge as known to those skilled in the art. As described above, a semiconductor in a semiconductor diode, such as a Schottky diode, may be doped to reduce an accumulation or depletion layer width and hence reduce the transport distance and time to increase the fraction of captured carriers.

Casimir photoinjector and plasmon injector current generation. Current generated by a Casimir photoinjector or plasmon injector can be used to generate products such as fuel or light. The current that can be generated may depend upon the characteristics of the optical Casimir cavity or the plasmon Casimir cavity and the materials and structure of the adjoining product generating device.

As noted above, the energy density from the quantum vacuum is provided by the temperature independent term in Eq. 1, which is $$\rho(hf) = \frac{8\pi f^2}{c^3}\left(\frac{hf}{2}\right) = \frac{4\pi h f^3}{c^3}. \quad \text{Eq. 2}$$

The flux of photons (number of photons per unit area per unit frequency) is given by $$j = \rho(hf)\frac{c}{4hf} \quad \text{Eq. 3}$$

where c is the arrival speed, hf is the photon energy, and ¼ is a geometrical factor for the radiation. The total flux (number of photons per unit area) is $$J = \int j\,df = \frac{\pi}{c^2}\int_{f_1}^{f_2} f^2 df = \frac{3\pi}{h^3 c^2}[(hf_2)^3 - (hf_1)^3] \quad \text{Eq. 4}$$

where $hf_1$ is the highest photon energy that is suppressed by the optical Casimir cavity, and $hf_1$ is lowest photon energy that provides sufficient energy for the photoexcited electron to surmount the barrier and tunnel through the transport layer. This low-energy cutoff is an approximation (the cutoff is actually gradual), because the reduction with photon energy follows an Airy function, which describes allowed cavity modes. The current that results from this flux is approximately $$I = Je = 2.37 \times 10^{-4}[(hf_2)^3 - (hf_1)^3] \text{ A/\mu m}_2 \quad \text{Eq. 5}$$

where e is the elementary charge.

For the case of a Casimir cavity providing a high energy cut off of 2.6 eV and an approximate low energy barrier cutoff of 1.6 eV, the resulting current is 3.2 mA/µm². The actual current may be much smaller because the photoinjection probability, which in an actual optical Casimir cavity is dependent upon the photon absorptivity in the first conductive layer, and is not unity. With a photoinjection probability of 0.05% and an optical Casimir cavity blocking efficiency of only 25%, the resulting current drops to 0.4 µA/µm². It will be appreciated that these numbers are provided for illustration purposes only and are not intended to be limiting. The actual output could be smaller or larger depending upon the Casimir photoinjector characteristics, geometries, materials, or the like.

In some cases, a photo- or plasmon-injection probability of 0.05% may be sufficient to achieve a useable current output. If the photo- or plasmon-injection probability is increased, however, even more current may be available. As described above, in equilibrium and in the absence of Casimir cavities, there is a balance of carrier currents between the two conductive layers. To maintain that balance, if there is an increase in the efficiency of photo- or plasmon-excited hot carriers in the first conductive layer traversing the transport layer then there must be a compensating reduction in the generation rate of internally generated hot carriers in the first conductive layer that can traverse the transport layer. Because the generation rate of photo- or plasmon-excited hot carriers is suppressed by the addition of a Casimir cavity, when the efficiency of photo- or plasmon-excited hot carriers in the first conductive layer traversing the transport layer is greater, then the carrier current that is suppressed by the addition of a Casimir cavity is greater. That suppression results in a greater imbalance between the current of carriers from the first conductive layer to the second conductive layer and the current of carriers from the second conductive layer to the first conductive layer, and hence a larger net current. Therefore, it may be advantageous to provide as efficient a process as possible for producing and/or injecting photo- or plasmon-excited hot carriers in the first conductive layer that can traverse the transport layer.

In some cases, structures to accomplish this can be integrated into the conductive layers of the product generating device, such as plasmonic nanostructures embedded into or on a surface of one or more of the conductive layers. Plasmonic nanostructures are a class of metamaterial in which nanoscale arrangements of materials, such as metals, can provide efficient coupling of electromagnetic radiation into the material and enhance hot carrier emission. Examples of plasmonic nanostructures for enhancing optical absorption are known in the art. See, e.g., Wang et al., 2011, "Plasmonic energy collection through hot carrier extraction," Nano Lett., 11:12, 5426-5430; Atar et al., 2013, "Plasmonically enhanced hot electron based photovoltaic device," Optics Express 21:6, 7196-7201; and Clavero, 2014, "Plasmon induced hot-electron generation at nanoparticle/metal-oxide interfaces for photovoltaic and photocatalytic devices," Nature Photonics, 8:2, 95-103; which are hereby incorporated by reference. Examples of plasmonic nanostructures providing enhanced hot carrier emission and injection, such as by factors of up to 25×, are known in the art. See, e.g., Knight et al., 2013, "Embedding plasmonic nanostructure diodes enhances hot electron emission," Nano Lett., 13:4, 1687-1692; Chalabi et al., 2014, "Hot-electron photodetection with a plasmonic nanostripe antenna," Nano Lett., 14:3, 1374-1380; and Brongersma, 2015, "Plasmon-induced hot carrier science and technology," Nature Nanotechnology, 10:1, 25-34, which are hereby incorporated by reference. Example plasmonic nanostructures useful with embodiments disclosed herein may include, but are not limited to, nanoparticles of a conductive material (e.g., metal) embedded into or on a surface of a conductive layer, such as over a non-conducting or insulating material on the surface of the conductive layer, and the patterning of the surface or interface of the conductive material.

One advantage of using a plasmon injector is that the injection efficiency of the zero-point energy driven plasmon excited charge carriers into the transport layer can be higher than a comparable injection efficiency from an optical Casimir cavity photoinjector system. As described above, in an optical Casimir cavity based photoinjector system, photons must be absorbed in the first conductor, and there is a loss associated with this process. In contrast, in a plasmon Casimir cavity system, the plasmons are present in the first conductor and do not need to undergo a similar absorption process to excite charge carriers.

Chemical reaction devices. Devices for which energy harvested from differences in zero-point energy densities is used to directly drive a chemical reaction are referred to herein as chemical reaction devices. Chemical reaction devices may comprise or correspond to photocatalytic devices, photoelectrolytic devices, and/or electrochemical devices, and may include multiple electrodes where oxidation and reduction reactions take place at a surface of the electrodes, using energy harvested from difference in zero-point energy densities in different regions or structures.

Photocatalysis, in general, and photoelectrolysis of water, in particular, can be carried out using systems similar to the Casimir photoinjector or plasmon injector devices described above with a chemical reaction device taking the place of the transport layer and second conductor in a Casimir photoinjector or plasmon injector. As used herein, the terms photocatalysis, electrochemical photolysis, photoelectrolysis, light-induced water splitting, and similar terms are used interchangeably to refer to electrochemical processes that occur at an electrode, and can manifest as oxidation and reduction reactions. In conventional systems, these processes can be mediated by absorption of light, but the oxidation and reduction processes in the systems described herein can be driven by differences in zero-point energy densities and by the resulting charge carrier generation and transport. Photoelectrolysis has been demonstrated using short wavelength light to produce hydrogen fuel. In a conventional photoelectrolysis cell where the cathode is illuminated, it uses photogenerated electrons that combine with hydrogen ions in the water to produce hydrogen gas. In contrast, to use a difference in zero-point energy densities as a power source, a Casimir cavity adjacent to such an electrode can be used, for example, to restrict the set of quantum vacuum modes it is exposed to, and it serves as the anode or cathode.

Figure 8:
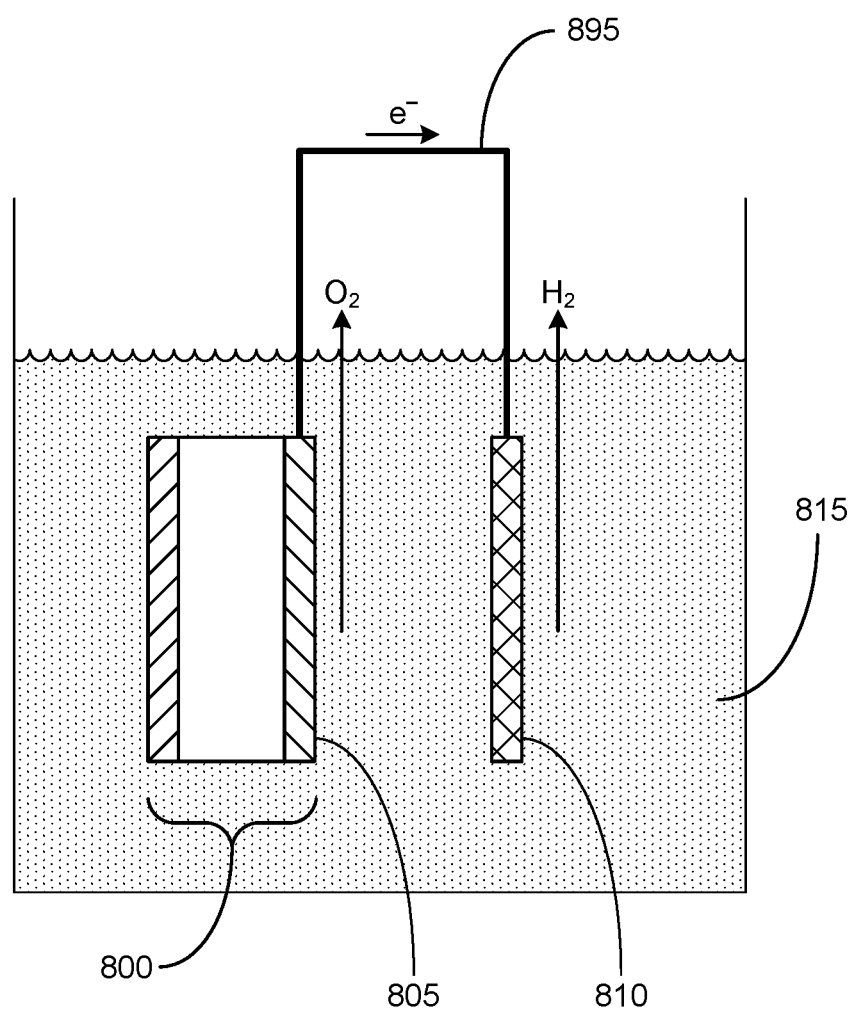
FIG. 8 provides a cross-sectional illustration of an example Casimir photocatalyzer, in accordance with some embodiments.

FIG. 8 shows an example system comprising a Casimir cavity 800 and a chemical reaction device, which may correspond to a Casimir photocatalyzer. Although Casimir cavity 800 is depicted as an optical Casimir cavity, other Casimir cavity configurations can be used, such as plasmon Casimir cavities, as described above. In the configuration shown, the chemical reaction device comprises a first electrode 805, serving as an anode, a second electrode 810, serving as a cathode, and an electrolyte 815 between first electrode 805 and second electrode 810. First electrode 805 and second electrode 810 are connected to each other by a conductor 895 and first electrode 805 can correspond to at least a portion of Casimir cavity 800. As depicted in FIG. 8, first electrode 805 can be a hybrid component that serves as both a reflector of Casimir cavity 800 and as an electrode in the chemical reaction device. In terms of a plasmon Casimir cavity, first electrode 805 can be a hybrid component that serves as both an end conductor of a conductor stack of Casimir cavity 800 and as an electrode in the chemical reaction device, for example. The second electrode 810 can be immersed in electrolyte 815, as shown in FIG. 8, but in some configurations the electrolyte 815 can be positioned just at a region between first electrode 805 and second electrode 810.

In the case of water as an electrolyte and water splitting as the chemical reaction, at the surface of the first electrode 805 exposed to the electrolyte 815, comprising water balanced with acid, the following reaction takes place:

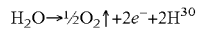

Oxygen gas is produced, and electrons flow through the conductor 895 to the second electrode 810. The H$^+$ ions are transported through the electrolyte 815 to the second electrode 810. At the surface of the second electrode 810 exposed to the electrolyte 815, the following reaction takes place:

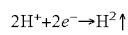

When the electrolyte 815 comprises water balanced with base, a similar reaction involving OH$^-$ takes place. In both cases, hydrogen gas is produced at the second electrode 810, where it can be collected to be used as a fuel.

Splitting water takes a minimum of 1.23 eV of energy and substantially more to drive the reaction at practical rates. Therefore, useful materials for the first electrode 805 should have a sufficiently high energy bandgap, such as up to 10 eV. One example material that suffices is SiC, with a bandgap of between 2.36 and 3.05 eV. Conventional photocatalysis has been demonstrated with a SiC photocathode. For production of hydrogen from harvesting differences in zero-point energy difference, SiC may be used as the first electrode 805 adjacent to the Casimir cavity 800. For an optical Casimir cavity, the Casimir cavity 800 must suppress optical modes of energy greater than that of the bandgap, and for a plasmon Casimir cavity, plasmon modes of a similar energy must be suppressed. For a bandgap of approximately 2.5 eV, that corresponds to a gap spacing in Casimir cavity 800 of less than 250 nm.

The amount of hydrogen produced can be estimated from Eq. 5. For an optical Casimir cavity with a spacing of 100 nm, the quantum vacuum modes below roughly 6.2 eV are suppressed. For an optical Casimir cavity gap spacing of 100 nm and SiC having a bandgap energy of approximately 2.5 eV, Eq. 5 gives 53 mA/(µm)$^2$.

Several factors can reduce the efficiency of hydrogen generation below what the optimal 53 mA/(µm)$^2$ would provide. One factor is the quality of the reflectors of an optical Casimir cavity in the visible and near ultraviolet wavelength ranges, which would be close to 100% for near-perfect reflectors. In some cases, depending upon the materials chosen, the reflectivity can be in the range of about 35% for gold to about 92% for aluminum when used as the hybrid reflector/first electrode side of the Casimir cavity 800, and about 5% to 50% for SiC when used as the hybrid reflector/first electrode side of an optical Casimir cavity. The medium filling the gap in an optical Casimir cavity can also limit the efficiency, in that an absorptive medium reduces its effectiveness. Vacuum or air can be a desirable medium, but it can be more practical to fill the cavity with a transmissive material such as an oxide or polymer. Such media have a bandgap that restricts the photon energy to low photon energies, and additional losses can result from absorption even in the transmissive part of the spectrum. Another factor is the imperfect optical absorption in the electrodes (e.g., the anode and/or cathode), which varies with wavelength and thickness. In addition to these optical inefficiencies, there are inefficiencies in the charge transport and hydrogen generation. One such factor is the excess energy of charge provided by the anode and/or cathode required to drive the reaction at desired rates. Electrode materials having large bandgaps that can provide large excess energies are often expensive and unstable in water, and even if available, they require the incident photons to have high energies, above approximately 3 eV. To obtain these high energies, an optical Casimir cavity would have a very small gap, well below 200 nm, to suppress sufficiently high energies. High energies would also provide a greater current, as described by Eq. 5, and higher absorption in the electrodes (e.g., the anode and/or cathode). However, high energies are also absorbed more by the optical Casimir cavity gap medium and tend to be reflected more poorly by the optical Casimir cavity reflectors. Furthermore, forming small-gap optical Casimir cavities is often technologically more challenging. Other efficiency-limiting factors include losses from resistance of the electrodes (e.g., the anode and/or cathode), of the water, and of the conductor. It will be appreciated that the numbers identified above are provided for illustrative purposes only and are note intended to be limiting. These values may vary greatly for different anode, cathode, and optical Casimir cavity materials, and for different cell configurations.

Estimating losses of a factor of 100 for the optical inefficiencies described above, and an additional factor of 100 for the charge transport and hydrogen generation process, gives an overall loss of a factor of $10^4$. This factor of $10^4$ would result in a reduction of the current from 53 mA/$(\mu m)^2$ to 5.3 $\mu$A/$(\mu m)^2$. Converting that current into $H_2$ production, gives a rate of approximately 28 pg/$(\mu m)^2$-sec, corresponding to 0.3 g/sec for an area of 100 $cm^2$. At this rate, approximately 1 kg of $H_2$ would be produced in one hour over that the 100 $cm^2$ area, which is sufficient to run a fuel-cell-powered vehicle continuously.

In some cases, parts of the system may produce heat, while others potentially absorb heat, resulting in cooling. The heat production resulting from the difference between an up-to-6.2 eV photon input and the roughly 1.5 eV required for electrolysis may limit the rate at which fuel can be reduced. For heat-absorbing parts of the system, high-density fuel production may be limited by the rate of heat transfer required to maintain the system temperature within operating limits, such as by application of heat or absorbing heat from the environment. An optical Casimir cavity having a larger gap spacing, to reduce the high photon energy input, and a cell having an area greater than 100 $cm^2$ may be useful for reducing the thermal flow per unit area.

The zero-point-energy-driven photoelectrolysis example given above is intended to be illustrative, and not limiting. There are many other materials and configurations for conventional photoelectrolysis that can be used, as is known to those skilled in the art. A Casimir cavity cathode can be used instead of an Casimir cavity anode, or both electrodes can incorporate Casimir cavities. The cathodes or anodes can alternatively be in the form of Schottky barriers, p-n junctions, semiconductor/liquid junctions and other devices known to those skilled in the art, and these semiconductor materials may be doped to reduce an accumulation or depletion layer width, for example. Examples of specific anode and cathode structures for solar driven water splitting systems, which can also be used in the systems described herein, are given in Walter, Michael G., et al, "Solar water splitting cells," Chemical Reviews, 110.11 (2010): 6446-6473, which is hereby incorporated by reference. If both electrodes incorporate Casimir cavities, then the effects can be additive, much like the case for conventional photoelectrolysis where the photon energy may not be sufficient for electrolysis with a single photoelectrode but use of both a photocathode and a photoanode can be useful for driving the photoelectrolysis. The water conductivity may vary depending upon the electrolyte content, and acid, base or salt electrolytes may be added. The gap between anode and cathode can be reduced to less than a Debye length, roughly 1 micron in pure water, to enhance ion transport. While the photoelectrolysis embodiment provided above is one example of zero-point-energy-driven photocatalysis, zero-point-energy-driven photocatalysis can be used more broadly with other fluids to provide other useful substances.

Figure 9A:
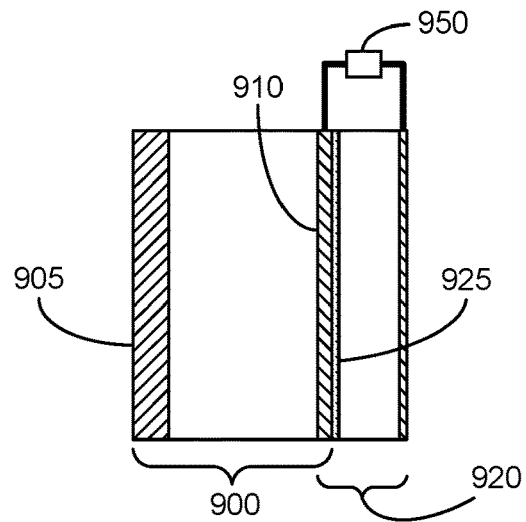
FIG. 9A, FIG. 9B, and FIG. 9C provide cross-sectional illustration of example Casimir light sources, in accordance with some embodiments.

Light emission devices. Light can be produced directly from variations of conductor/insulator/conductor structures, such as those described above with respect to Casimir photoinjectors and plasmon injectors in a system referred to herein as a Casimir light source. One example of a Casimir light source can employ use of structures exhibiting cathodoluminescence. FIG. 9A shows an example of a Casimir light source incorporating a light emission device 920 comprising a luminescent structure 925 coupled to a Casimir cavity 900, which may be referred to herein as a Casimir cathodoluminescence system. In the Casimir photoinjectors described above with respect to FIG. 5, a net flow of hot electrons is excited from second conductive layer 560 to first conductive layer 555. In the plasmon injectors described above with respect to FIG. 7, a net flow of hot electrons is excited from second conductor 730 to first conductor 720. By placing a luminescent structure 925, such as a nanosheet phosphor, for example a 2.4 nm thick nanosheet or double-layered perovskite, in the transport layer adjacent to the Casimir cavity 900, or in place of the transport layer, the hot electrons can impinge on the phosphor and produce light, such as via a cathodoluminescence mechanism. Casimir cavity 900 is exemplified in FIG. 9A as an optical Casimir cavity comprising a first reflective layer 905 and a second reflective layer 910, which can serve as a hybrid layer, providing the first conductor in the light emission device 920. Other configurations can be used for Casimir cavity 900, such as a plasmon Casimir cavity, where the end conductor of a conductor stack of Casimir cavity 900 serves as a hybrid layer, providing the first conductor in the light emission device 920, for example.

Figure 9B:
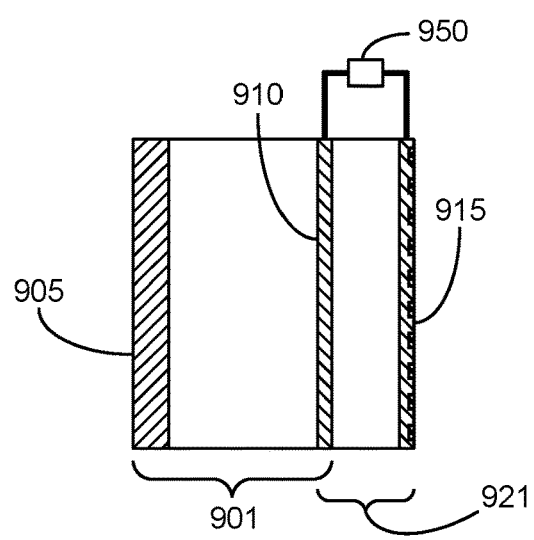

Light can also be emitted by applying a voltage across a conductor/insulator/conductor tunneling junction to produce inelastic tunneling that excites surface plasmon modes that produce radiation. This can be seen, for example, in a Al/$Al_2O_3$/Au device. FIG. 9B shows an example of a Casimir light source incorporating a light emission device comprising an inelastic tunneling structure 921 coupled to a Casimir cavity 901. Such a system can be similar to the photoinjectors or plasmon injectors described above, where the inelastic tunneling structure 921 replaces a conductor/insulator/conductor structure, allowing light to be directly produced. In the configuration shown, plasmons can be formed on either or both of the electrodes of inelastic tunneling structure 921. The effect can be enhanced by inducing surface plasmon modes to aid in the light emission, for example by producing the conductor insulator conductor structures on a roughened surface, schematically illustrated in FIG. 9B by structures present at the right surface of electrode 915. One way to produce such a roughened surface is described in McCarthy, S. L., and John Lambe, "Enhancement of light emission from metal-insulator-metal tunnel junctions," Applied Physics Letters, 30.8 (1977): 427-429, which is hereby incorporated by reference. Casimir cavity 901 is again exemplified in FIG. 9B as an optical Casimir cavity comprising a first reflective layer 905 and a second reflective layer 910, which can serve as a hybrid layer, providing an electrode of the inelastic tunneling structure 921, but other configurations can be used for Casimir cavity 901, such as a plasmon Casimir cavity, where the end conductor of a conductor stack of Casimir cavity 901 serves as a hybrid layer, providing an electrode of the inelastic tunneling structure 921, for example.

Figure 9C:
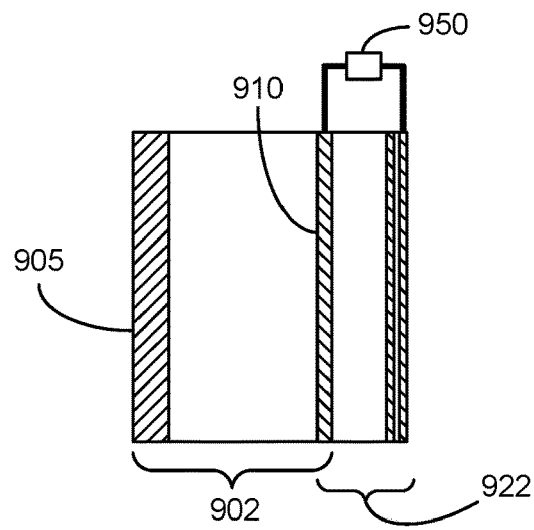

Still another way to produce light directly is using negative differential resistance. FIG. 9C shows an example of a system incorporating a light emission device comprising a structure 922 exhibiting negative differential resistance coupled to a Casimir cavity 902. An example configuration for structure 922 can comprise a double barrier $Al/Al_2O_3/Al/Al_2O_3/Au$ with 3 to 6 nm thick $Al_2O_3$ layers. Such a structure 922 can produce negative differential resistance at a bias of approximately 1 volt. By using such a double barrier structure, the current and voltage induced as a result of the Casimir cavity 902 can produce the needed power for light emission. Casimir cavity 902 is exemplified in FIG. 9C as an optical Casimir cavity comprising a first reflective layer 905 and a second reflective layer 910, which can serve as a hybrid layer, providing the first conductor in the double barrier structure 922. Again, although Casimir cavity 902 is exemplified in FIG. 9C as an optical Casimir cavity comprising a first reflective layer 905 and a second reflective layer 910, other configurations can be used for Casimir cavity 902, such as a plasmon Casimir cavity.

In each of the systems described above including a light emission device, the current returns through an element 950. Element 950 can be a resistor, for example, that supports a voltage difference between two electrodes. Element 950 can alternatively be a short circuit, which may be beneficial in the case of FIG. 9A, which does not need to support a voltage difference. Element 950 can also be a battery or load, which makes use of the power from the return current.

To make the light visible outside of the device, the systems can optionally be formed as an array of very narrow structures, less than 200 nm wide, such that the light is emitted at the edges of the structures. Alternatively, the outermost electrode of the light emission device (e.g., opposite the side adjacent to the Casimir cavity) can comprise a transparent conductor, such as indium tin oxide (ITO), and the light can be emitted through the transparent conductor.

Systems comprising light emission devices can be used for general illumination, and also to couple directly to plants and chlorophyll for biosynthesis. The appropriate wavelengths to energize chlorophyll to produce carbohydrates are roughly between 400 nm and 700 nm, corresponding to photon energies of 3 eV to 1.7 eV, and the light-producing devices described above can be tuned to that range using the relationship between an optical Casimir cavity gap width and photon energy. The configurations described above can provide continuous illumination when desired, even in the absence of application of an external voltage or current.

Device arrays. To achieve large output amounts of light or fuel, multiple systems described herein can be configured into an array, such that the output from each individual system is integrated to provide a higher total output from the array.

Figure 10A:
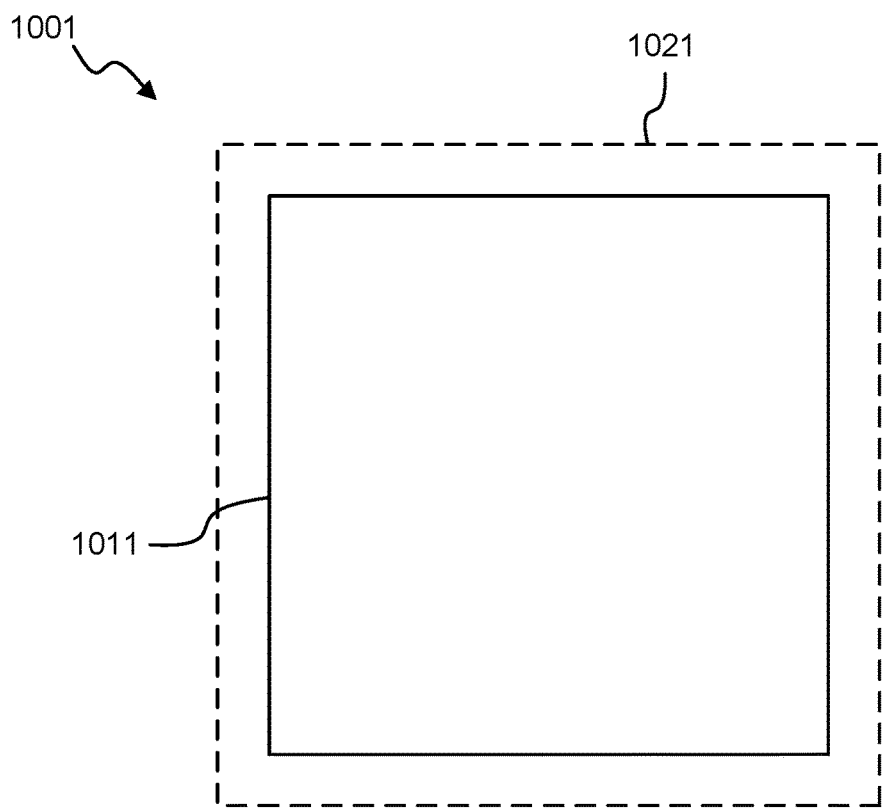
FIG. 10A provides a layout of patterns for fabricating an example Casimir cathodoluminescence system, in accordance with at least some embodiments.
Figure 10B:
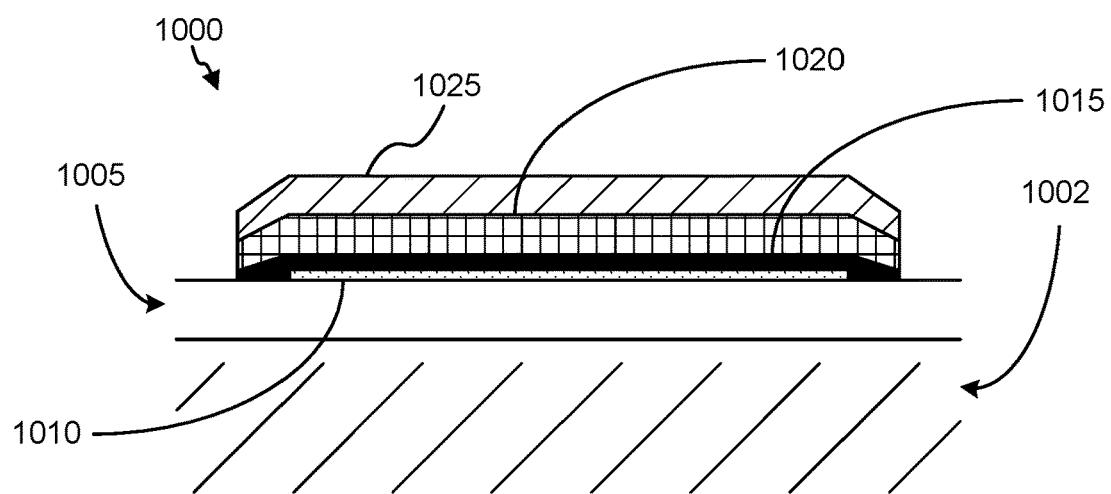
FIG. 10B provides a cross-sectional illustration of an example Casimir cathodoluminescence system, in accordance with at least some embodiments.

Device fabrication. An example fabrication process according to a pattern 1001 shown in FIG. 10A for a Casimir cathodoluminescence system 1000 as illustrated in cross-section in FIG. 10B is described below. The device is formed on a glass substrate 1002, through which the light that is produced is emitted.

Casimir cathodoluminescence system 1000 is shown comprising a transparent conductor/phosphor/conductor device, which comprises a transparent conductor layer 1005, a phosphor layer 1010 (corresponding to a transport layer), and a second conductor layer 1015, adjacent to an optical Casimir cavity. The optical Casimir cavity comprises the second conductor layer 1015, a cavity layer 1020, and a reflective layer 1025. Pattern 1001 includes a transport/phosphor layer pattern 1011 and a second conductor layer/Casimir cavity pattern 1021. The optical Casimir cavity restricts quantum vacuum energy modes on one side of a light generating device comprising second conductor layer 1015, phosphor layer 1010, and transparent conductor layer 1005.

In an example, a cell comprising a Casimir cathodoluminescence system 1000 may have an active area of 100 μm×100 μm. The Casimir cathodoluminescence system 1000 can be adjacent to other Casimir cathodoluminescence systems to form an array.

Transparent conductor layer. The transparent conductor layer 1005, composed of indium tin oxide (ITO), forms the base layer for the Casimir cathodoluminescence system 1000. It coats the entire glass substrate and is not patterned. By way of example, the following steps can be used for preparation of the transparent conductor layer 1005:

1. ITO is sputtered onto the glass substrate from a ceramic $In_2O_3$—$SnO_2$ target in a gas of argon with a small quantity of oxygen, to a thickness of 200 nm.

Transport and phosphor layers. Hot electrons generated in the transparent conductor layer 1005 are injected into and excite light emission in the phosphor layer 1010. In this example the transport layer consists solely of the phosphor layer 1010. As described above, however, the phosphor layer 1010 can optionally comprise a sublayer of the transport layer. By way of example, the following steps can be used for preparation of the phosphor layer 1010:

1. Negative photoresist is spun onto the ITO-coated substrate 1002 and soft baked.
2. Using an aligner, the transport/phosphor layer pattern 1011 shown in FIG. 10A is exposed, followed by a post-exposure bake, develop and rinse.
3. The phosphor is then applied onto the surface. It comprises an exfoliated sheet of double-layered perovskite, $NaGdMgWO_6:Eu^{3+}$, which is prepared as described in Viswanath, N. S. M., et al. "A nanosheet phosphor of double-layered perovskite with unusual intrananosheet site activator concentration," Chemical Engineering Journal, 2019, 122044, which is herein incorporated by reference. It is 2.4 nm thick.
4. The phosphor is lifted off with acetone, followed by isopropanol and then a water rinse, to form the phosphor layer 1010.
5. The remaining photoresist is cleaned off with a brief oxygen plasma.

Second conductor layer, Casimir cavity transparent layer and mirror. Second conductor layer 1015 forms the upper conductive layer, absorbing photons from the optical Casimir cavity to produce hot electrons, and makes contact with the phosphor layer 1010 and also with the transparent conductor layer 1005. This contact forms, for example, the element 950 shown in FIG. 9C. These layers are deposited and then patterned together. By way of example, the following steps can be used for preparation of the second conductor layer 1015, cavity layer 1020, and reflective layer 1025:

1. 15 nm of palladium is evaporated onto the substrate to form second conductor layer 1015.

2. 30 nm of SiO$_2$ is deposited by sputtering onto the substrate for use as a cavity layer 1020, followed by 150 nm of aluminum for use as reflective layer 1025.
3. Positive photoresist is spun onto the substrate and soft baked.
4. Using an aligner, the field for the second conductor layer/Casimir cavity pattern 1021 is exposed, followed by a post-exposure bake, develop and rinse.
5. The exposed aluminum and SiO$_2$ are etched with 6:1 buffered oxide etch (BOE), followed by a water rinse, to form the reflective layer 1025 and cavity layer 1020 of the optical Casimir cavity.
6. The exposed palladium is etched with a CF$_4$—Ar plasma to complete patterning of second conductor layer 1015.
5. The remaining photoresist is cleaned off with an oxygen plasma.

It will be appreciated that the above description of a fabrication scheme for making a Casimir cathodoluminescence system 1000 is merely exemplary and that a variety of different dimensions, processing schemes, materials, patterns, or the like may be used by the skilled artisan to prepare Casimir cathodoluminescence systems.

Example ranges of dimensions. Although a cell size of 100 μm×100 μm is described above, other cell sizes can be used. Example cell sizes may be from 0.1 μm on an edge up to 1 meter. In some examples, the chosen size can be determined by (i) the desired resistance of the element so as not to create too large a voltage drop between the transparent conductor and the second conducting layer, (ii) a sufficiently small pattern arrayed to provide uniform illumination over a given area, and (iii) the ease of fabrication.

Regarding ease of fabrication, smaller cells may require more expensive or complex fabrication. For example, large area devices having feature sizes of at least 1 mm can be patterned by inexpensive screen printing, whereas submicron features may require very expensive deep-UV lithography. There are exceptions, however. For example, nanoimprint lithography can produce some types of submicron features inexpensively, and roll-to-roll manufacturing can produce small features cheaply over large areas. Still, usually larger features can be easier to manufacture.

The transparent conducting layer (e.g., ITO) may be sufficiently thick to provide low sheet resistance (e.g., greater than 50 nm), but thin enough that it does not create substantial optical absorption for the emitted light.

The transport layer may be sufficiently thin to allow a large injected electron current through both the transport and the phosphor layers, but thick enough to facilitate hot electron emission. In the given example above, the phosphor layer provides this function.

The thickness of second conductive layer can be important for producing high currents and therefore bright illumination. There is a tradeoff between films that are too thin to absorb light from the optical Casimir cavity and too thick to provide injected electrons. If the second conductive layer is too thin, it can absorb too little of the incoming photon flux from the optical Casimir cavity. In the case of the second conductive layer being extremely thin, its sheet conductance will be too small and will limit the available current. If the second conductive layer is too thick, then hot electrons generated at the optical Casimir cavity interface may not be able to reach the transport/phosphor layer before being scattered. For example, the ballistic mean-free path length in gold is 38 nm, and it is lower in palladium. In some examples, the second conductive layer thickness can fall in the range of 5 nm to 50 nm. For metals patterned to make use of plasmonic effects described elsewhere in the specification, the metals can be thicker, and for other thin film materials, such as graphene and molybdenum disulfide, the materials can be as thin as a single monolayer.

Another function of the second conductive layer is to provide adequate sheet conductance to carry the current to the transparent conducting layer.

Illustrative Aspects

As used below, any reference to a series of aspects (e.g., "Aspects 1-4") or non-enumerated group of aspects (e.g., "any previous or subsequent aspect") is to be understood as a reference to each of those aspects disjunctively (e.g., "Aspects 1-4" is to be understood as "Aspects 1, 2, 3, or 4").

Aspect 1 is a system comprising: a product generating device; and a zero-point-energy-density-reducing structure adjoining the product generating device, the zero-point-energy-density-reducing structure providing an asymmetry with respect to the product generating device that drives a flow of energy through the product generating device.

Aspect 2 is the system of any previous or subsequent aspect, wherein the flow of energy occurs even in an absence of external sources of illumination.

Aspect 3 is the system of any previous or subsequent aspect, wherein the flow of energy occurs even in an absence of application of voltage or current to the product generating device from an external source.

Aspect 4 is the system of any previous or subsequent aspect, wherein the zero-point-energy-density-reducing structure comprises a Casimir cavity.

Aspect 5 is the system of any previous or subsequent aspect, wherein the zero-point-energy-density-reducing structure comprises an optical Casimir cavity.

Aspect 6 is the system of any previous or subsequent aspect, wherein the zero-point-energy-density-reducing structure comprises a plasmon Casimir cavity.

Aspect 7 is the system of any previous or subsequent aspect, wherein the product generating device comprises a chemical reaction device driven by the flow of energy.

Aspect 8 is the system of any previous or subsequent aspect, wherein the product generating device comprises a fuel production device.

Aspect 9 is the system of any previous or subsequent aspect, wherein the product generating device comprises an electrolysis device.

Aspect 10 is the system of any previous or subsequent aspect, wherein the product generating device comprises a photocatalysis device.

Aspect 11 is the system of any previous or subsequent aspect, wherein the product generating device comprises: a first electrode adjoining the zero-point-energy-density-reducing structure; a second electrode in electrical communication with the first electrode; and an electrolyte between the first electrode and the second electrode.

Aspect 12 is the system of any previous or subsequent aspect, wherein the first electrode comprises a semiconductor having a band gap from 1.23 eV to 10 eV.

Aspect 13 is the system of any previous or subsequent aspect, operable for electrolysis of water.

Aspect 14 is the system of any previous or subsequent aspect, wherein the first electrode comprises SiC.

Aspect 15 is the system of any previous or subsequent aspect, wherein the electrolyte comprises water.

Aspect 16 is the system of any previous or subsequent aspect, wherein the first electrode comprises a reflective layer of the zero-point-energy-density-reducing structure.

Aspect 17 is the system of any previous or subsequent aspect, wherein the first electrode comprises a structured conductor of the zero-point-energy-density-reducing structure.

Aspect 18 is the system of any previous or subsequent aspect, wherein the product generating device comprises a light emission device driven by the flow of energy.

Aspect 19 is the system of any previous or subsequent aspect, wherein the light emission device comprises: a first conductive layer adjoining the zero-point-energy-density-reducing structure; a transport layer adjacent to the first conductive layer; and a second conductive layer adjacent to the transport layer.

Aspect 20 is the system of any previous or subsequent aspect, wherein the second conductive layer comprises a transparent conductor.

Aspect 21 is the system of any previous or subsequent aspect, wherein the first conductive layer comprises a reflective layer of the zero-point-energy-density-reducing structure.

Aspect 22 is the system of any previous or subsequent aspect, wherein the first conductive layer comprises a structured conductor of the zero-point-energy-density-reducing structure.

Aspect 23 is the system of any previous or subsequent aspect, wherein the light emission device comprises a phosphor positioned adjacent to the zero-point-energy-density-reducing structure.

Aspect 24 is the system of any previous or subsequent aspect, wherein the light emission device comprises a cathodoluminescent structure.

Aspect 25 is the system of any previous or subsequent aspect, wherein the light emission device comprises a perovskite nanosheet phosphor positioned adjacent to the zero-point-energy-density-reducing structure.

Aspect 26 is the system of any previous or subsequent aspect, wherein the light emission device comprises a plasmon-driven light emission device.

Aspect 27 is the system of any previous or subsequent aspect, wherein the light emission device comprises an conductor/insulator/conductor tunneling junction.

Aspect 28 is the system of any previous or subsequent aspect, wherein at least one conductor includes a metasurface.

Aspect 29 is the system of any previous or subsequent aspect, wherein at least one conductor includes a structural discontinuity.

Aspect 30 is the system of any previous or subsequent aspect, wherein the light emission device exhibits a negative differential resistance.

Aspect 31 is the system of any previous or subsequent aspect, wherein the light emission device comprises a double barrier junction.

Aspect 32 is the system of any previous or subsequent aspect, wherein the light emission device comprises a conductor/insulator/conductor/insulator/conductor structure.

Aspect 33 is the system of any previous or subsequent aspect, wherein the light emission device emits light having at least some wavelengths from 400 nm to 700 nm.

Aspect 34 is the system of any previous or subsequent aspect, wherein the Casimir cavity comprises: a first reflective layer; a cavity layer; and a second reflective layer, wherein the cavity layer is between the first reflective layer and the second reflective layer.

Aspect 35 is the system of any previous or subsequent aspect, wherein the cavity layer comprises a condensed-phase optically transparent material layer.

Aspect 36 is the system of any previous or subsequent aspect, wherein the cavity layer comprises a material having a transmittance of greater than 20% for at least some wavelengths of electromagnetic radiation from 100 nm to 10 µm.

Aspect 37 is the system of any previous or subsequent aspect, wherein a reflectivity of at least one of the first reflective layer or the second reflective layer is greater than 50%.

Aspect 38 is the system of any previous or subsequent aspect, wherein the second reflective layer comprises a conductive layer of the product generating device.

Aspect 39 is the system of any previous or subsequent aspect, wherein the Casimir cavity comprises: a conductor structured to limit a range of zero-point energy plasmon modes within the conductor.

Aspect 40 is the system of any previous or subsequent aspect, wherein the conductor comprises a component of the product generating device.

Aspect 41 is the system of any previous or subsequent aspect, wherein the conductor comprises a series of alternating sublayers of at least two different conductors.

Aspect 42 is the system of any previous or subsequent aspect, wherein the alternating sublayers independently have thicknesses of from 0.3 nm to 1 µm.

Aspect 43 is the system of any previous aspect, wherein a dielectric or a semiconductor comprises at least a part of one sublayer.

REFERENCES

U.S. Pat. Nos. 7,379,286, 8,803,340, and 9,581,142.

Atar et al., 2013, "Plasmonically enhanced hot electron based photovoltaic device," Optics Express 21:6, 7196-7201.

Blandford and Thorne, 2008, "Applications of Classical Physics," Lecture Notes Chapter 6, California Institute of Technology, Version 12.

Brongersma, 2015, "Plasmon-induced hot carrier science and technology," Nature Nanotechnology, 10:1, 25-34.

Chalabi et al., 2014, "Hot-electron photodetection with a plasmonic nanostripe antenna," Nano Lett., 14:3, 1374-1380.

Clavero, 2014, "Plasmon induced hot-electron generation at nanoparticle/metal-oxide interfaces for photovoltaic and photocatalytic devices," Nature Photonics, 8:2, 95-103.

Du et al., 2013, "Ultrafast plasmon induced electron injection mechanism in gold-$TiO_2$ nanoparticle system." J. Photochem. and Photobiol. C: Photochem. Revs., 15, 21-30.

Gall, 2016, "Electron mean free path in elemental metals," J. Appl. Phys., 119:8, 085101.

Genet et al., 2003, "Casimir force and the quantum theory of lossy optical cavities," Phys. Rev. A., 67:4, 043811.

Gong et al., 2007, "Design of plasmonic cavities for solid-state cavity quantum electrodynamics applications," Appl. Phys. Lett., 90:3, 033113.

Helman et al., 1973, "Theory of internal photoemission," Phys. Rev. B, 7:8, 3702.

Herner et al., 2017, "High performance MIM diode based on cobalt oxide/titanium oxide," Appl. Phys. Lett., 110, 223901.

Jiang et al., 2017, "Photoelectrochemical devices for solar water splitting—materials and challenges," Chem. Soc. Rev., 46:15, 4645-4660.

John et al., 2017, "Optical properties of graphene, silicene, germanene, and stanene from IR to far UV—a first principles study," J. Phys. and Chem. of Solids, 110, 307-315.

Kish, 2005, "Stealth communication: Zero-power classical communication, zero-quantum quantum communication and environmental-noise communication," Appl. Phys. Lett., 87:23, 234109.

Kish et al., 2016, "Zero-point term and quantum effects in the Johnson noise of resistors: a critical appraisal," J. Stat. Mech.: Theory and Experiment, 2016:5, 054006.

Knight et al., 2013, "Embedding plasmonic nanostructure diodes enhances hot electron emission," Nano Lett., 13:4, 1687-1692.

Kodama et al., 2001, "Fast heating of ultrahigh-density plasma as a step towards laser fusion ignition," Nature, 412:6849, 798.

Lambe et al., 1976, "Light emission from inelastic electron tunneling," Phys. Rev. Lett., 37:14, 923.

Lebedev et al., 1999, "The dynamics of wire array Z-pinch implosions," Phys. of Plasmas, 6:5, 2016-2022.

Li, Rengui, 2017, "Latest progress in hydrogen production from solar water splitting via photocatalysis, photoelectrochemical, and photovoltaic-photoelectrochemical solutions," Chinese Journal of Catalysis, 38:1, 5-12.

McCarthy et al., 1977, "Enhancement of light emission from metal-insulator-metal tunnel junctions," Appl. Phys. Lett., 30:8, 427-429.

Mizuguchi et al., 2007, "Simulation of high-energy proton production by fast magnetosonic shock waves in pinched plasma discharges," Phys. of Plasmas, 14:3, 032704.

Moddel, G. and Dmitriyeva, O., 2019, "Extraction of Zero-Point Energy from the Vacuum: Assessment of Stochastic Electrodynamics-Based Approach as Compared to Other Methods," Atoms, 7(2), 51.

Ozawa, et al., 2007, "Preparation and characterization of the $Eu^{3+}$ doped perovskite nanosheet phosphor: $La_{0.90}Eu_{0.05}Nb_2O_7$," Chemistry of Materials, 19:26, 6575-6580.

Sze et al., 2006, "Physics of semiconductor devices," John Wiley & Sons, p. 682.

van Dorp et al., 2009, "SiC: a photocathode for water splitting and hydrogen storage," Angewandte Chemie Intl. Ed., 48:33, 6085-6088

Viswanath et al., 2019, "A nanosheet phosphor of double-layered perovskite with unusual intrananosheet site activator concentration," Chem. Eng. J., 122044.

Wang et al., 2000, "Light emission from the double-barrier $Al/Al_2O_3/Al/Al_2O_3/Au$ tunnel junction," Thin Solid Films, 371:1-2, 191-194.

Wang et al., 2011, "Plasmonic energy collection through hot carrier extraction," Nano Lett., 11:12, 5426-5430.

Wang et al., 2017, "Field-assisted splitting of pure water based on deep-sub-debye-length nanogap electrochemical cells," ACS Nano, 11:8, 8421-8428.

Walter et al., 2010, "Solar water splitting cells," Chem. Rev. 110:11, 6446-6473.

Zhu, 2014, "Graphene Geometric Diodes for Optical Rectennas," PhD Thesis, University of Colorado, 68-77.

STATEMENTS REGARDING INCORPORATION BY REFERENCE AND VARIATIONS

All references throughout this application, for example patent documents including issued or granted patents or equivalents, patent application publications, and non-patent literature documents or other source material, are hereby incorporated by reference herein, as though individually incorporated by reference.

All patents and publications mentioned in the specification are indicative of the levels of skill of those skilled in the art to which the invention pertains. References cited herein are incorporated by reference herein to indicate the state of the art, in some cases as of their filing date, and it is intended that this information can be employed herein, if needed, to exclude (for example, to disclaim) specific embodiments that are in the prior art.

When a group of substituents is disclosed herein, it is understood that all individual members of those groups and all subgroups and classes that can be formed using the substituents are disclosed separately. When a Markush group or other grouping is used herein, all individual members of the group and all combinations and subcombinations possible of the group are intended to be individually included in the disclosure. As used herein, "and/or" means that one, all, or any combination of items in a list separated by "and/or" are included in the list; for example "1, 2 and/or 3" is equivalent to "'1' or '2' or '3' or '1 and 2' or '1 and 3' or '2 and 3' or '1, 2 and 3'".

Every formulation or combination of components described or exemplified can be used to practice the invention, unless otherwise stated. Specific names of materials are intended to be exemplary, as it is known that one of ordinary skill in the art can name the same material differently. It will be appreciated that methods, device elements, starting materials, and synthetic methods other than those specifically exemplified can be employed in the practice of the invention without resorting to undue experimentation. All art-known functional equivalents, of any such methods, device elements, starting materials, and synthetic methods are intended to be included in this invention. Whenever a range is given in the specification, for example, a temperature range, a time range, or a composition range, all intermediate ranges and subranges, as well as all individual values included in the ranges given are intended to be included in the disclosure.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. Any recitation herein of the term "comprising", particularly in a description of components of a composition or in a description of elements of a device, is understood to encompass those compositions and methods consisting essentially of and consisting of the recited components or elements. The invention illustratively described herein suitably may be practiced in the absence of any element or elements, limitation or limitations which is not specifically disclosed herein.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

What is claimed is:

1. A system comprising:
   a device; and
   a zero-point-energy-density-modifying structure adjoining the device, the zero-point-energy-density-modifying structure providing an asymmetry with respect to the device that drives a flow of energy through the device.

2. The system of claim 1, wherein the zero-point-energy-density-modifying structure is a first zero-point-energy-density-modifying structure, the system further comprising:
   a second zero-point-energy-density-modifying structure adjoining the device, the device positioned between the first zero-point-energy-density-modifying structure and the second zero-point-energy-density-modifying structure, and wherein the first zero-point-energy-density-modifying structure and the second zero-point-energy-density-modifying structure have different geometries or comprise different materials.

3. The system of claim 1, wherein the zero-point-energy-density-modifying structure comprises a Casimir cavity.

4. The system of claim 3, wherein the Casimir cavity is an optical Casimir cavity.

5. The system of claim 3, wherein a cavity layer of the Casimir cavity comprises a solid, a liquid, a liquid crystal, or a conducting medium.

6. The system of claim 3, wherein the Casimir cavity is a plasmon Casimir cavity.

7. The system of claim 3, wherein a cavity layer of the Casimir cavity comprises a multilayer conductor stack.

8. The system of claim 1, wherein the device is a product generating device.

9. The system of claim 8, wherein the product generating device comprises a fuel production device.

10. The system of claim 9, wherein the fuel production device is a hydrogen production device.

11. The system of claim 9, wherein the fuel production device is an electrolysis device or a photocatalysis device.

12. The system of claim 1, wherein the device is an electronic device.

13. The system of claim 12, wherein the electronic device comprises:
    a first conductive layer comprising a component of the zero-point-energy-density-modifying structure;
    a transport layer disposed adjacent to and in contact with the first conductive layer; and
    a second conductive layer disposed adjacent to and in contact with the transport layer.

14. The system of claim 12, wherein the electronic device is a diode or a resistor.

15. The system of claim 12, wherein the electronic device is a light emission device comprising a phosphor.

16. A method comprising:
    providing a system comprising:
      a device; and
      a zero-point-energy-density-modifying structure adjoining the device, the zero-point-energy-density-modifying structure providing an asymmetry with respect to the device that drives a flow of energy through the device; and
    positioning a product-generating medium adjoining, adjacent to, or in contact with the device to generate products by way of the flow of energy through the device.

17. The method of claim 16, wherein the product-generating medium comprises a phosphor and wherein the products comprise photons.

18. The method of claim 16, wherein the product-generating medium comprises an electrolyte and wherein the products comprise a gas.

19. The method of claim 18, wherein the product-generating medium comprises an aqueous electrolyte and wherein the products comprise oxygen gas and/or hydrogen gas.

20. The method of claim 16, wherein the flow of energy corresponds to hot electrons generated at or captured in the device and wherein the product-generating medium receives the hot electrons or energy associated with the hot electrons to generate the products.

* * * * *